(12) United States Patent
Nakamura

(10) Patent No.: US 12,009,413 B2
(45) Date of Patent: Jun. 11, 2024

(54) SEMICONDUCTOR DEVICE AND METHOD FOR MANUFACTURING THE SAME

(71) Applicant: Mitsubishi Electric Corporation, Tokyo (JP)

(72) Inventor: Katsumi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 135 days.

(21) Appl. No.: 17/457,320

(22) Filed: Dec. 2, 2021

(65) Prior Publication Data
US 2022/0285537 A1     Sep. 8, 2022

(30) Foreign Application Priority Data
Mar. 8, 2021    (JP) .................................. 2021-036331

(51) Int. Cl.
*H01L 29/739*     (2006.01)
*H01L 29/66*     (2006.01)

(52) U.S. Cl.
CPC .... *H01L 29/7397* (2013.01); *H01L 29/66325* (2013.01)

(58) Field of Classification Search
CPC . H01L 29/407; H01L 29/456; H01L 29/0834; H01L 29/32; H01L 29/861; H01L 29/8613; H01L 27/0629; H01L 29/0615; H01L 29/0684; H01L 29/66325–66348; H01L 29/7393–7398; H01L 2924/13055; H01L 29/36–365
See application file for complete search history.

(56) References Cited

U.S. PATENT DOCUMENTS

| 2014/0306267 A1 | 10/2014 | Kameyama |
| 2016/0284693 A1 | 9/2016 | Kameyama |

(Continued)

FOREIGN PATENT DOCUMENTS

| CN | 107910367 A | * | 4/2018 |
| JP | 2004-311481 A | | 11/2004 |

(Continued)

OTHER PUBLICATIONS

An Office Action; "Notice of Reasons for Refusal," mailed by the Japanese Patent Office on Mar. 5, 2024, which corresponds to Japanese Patent Application No. 2021-036331 and is related to U.S. Appl. No. 17/457,320; with English language translation.

*Primary Examiner* — Shahed Ahmed
(74) *Attorney, Agent, or Firm* — Studebaker & Brackett PC

(57) ABSTRACT

A semiconductor device includes a semiconductor substrate, a drift layer of a first conductivity type, a buffer layer of the first conductivity type, a first semiconductor layer, and a second semiconductor layer. The first semiconductor layer and the second semiconductor layer are provided on the side of the second main surface of the semiconductor substrate with respect to the buffer layer. The first semiconductor layer and the second semiconductor layer are arranged in this order in a direction from the second main surface toward the first main surface of the semiconductor substrate. The first semiconductor layer and the second semiconductor layer have conductivity types identical to each other. The second semiconductor layer has a larger number of atoms of impurities per unit volume than the first semiconductor layer.

17 Claims, 34 Drawing Sheets

(56) References Cited

U.S. PATENT DOCUMENTS

2019/0006494 A1* 1/2019 Matsudai ............ H01L 29/0696
2022/0254775 A1* 8/2022 Yoshida ................ H01L 29/36

FOREIGN PATENT DOCUMENTS

| JP | 2005-259779 A | 9/2005 |
| JP | 2007-123469 A | 5/2007 |
| JP | 2010-050307 A | 3/2010 |
| JP | 2016-143804 A | 8/2016 |
| JP | 2020-182009 A | 11/2020 |
| WO | 2013/069113 A1 | 5/2013 |

* cited by examiner

F I G. 7
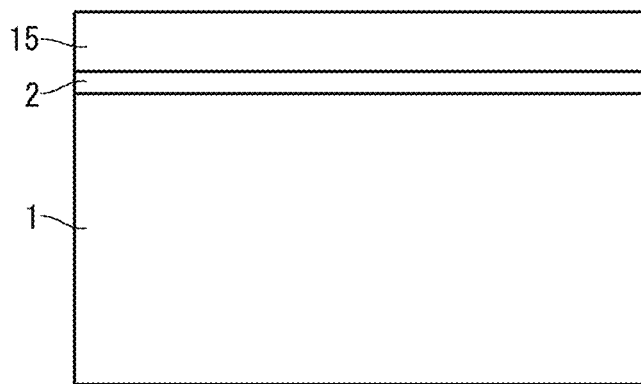

F I G. 8
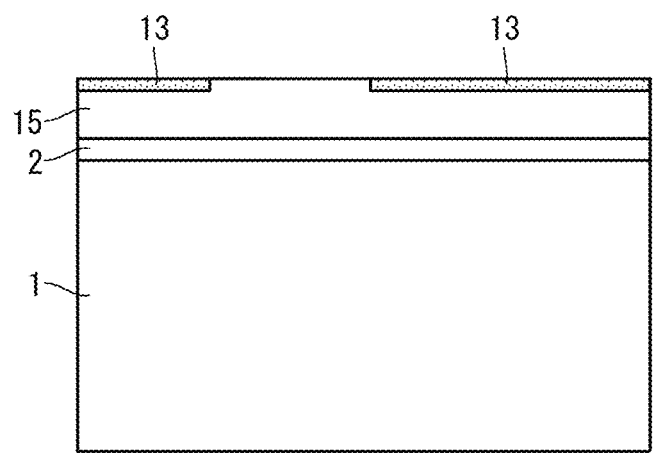

F I G. 1 0
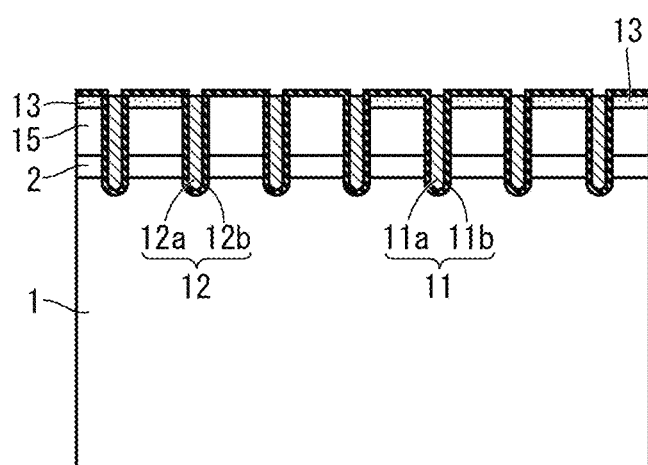

F I G. 1 1
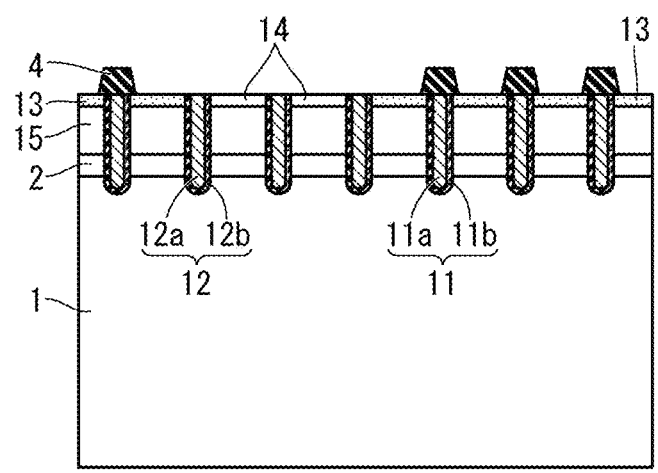

F I G. 1 2
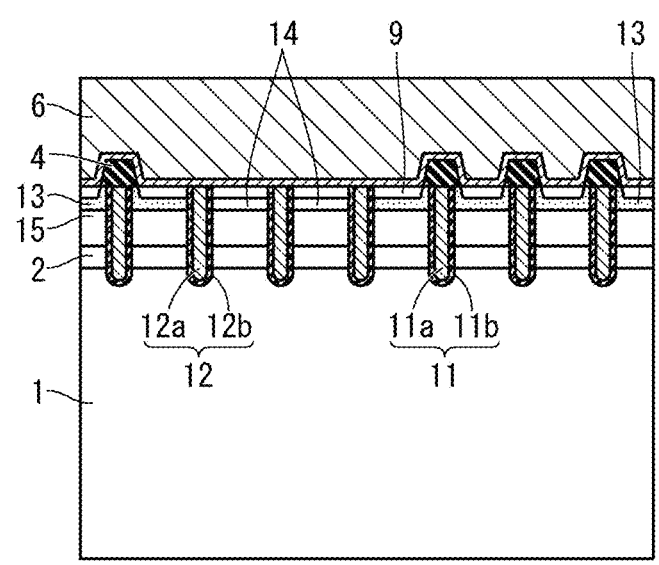

FIG. 14

| 1 | GRINDING |
| --- | --- |
| 2 | ETCHING |
| 3 | ION IMPLANTATION STEP (FOR n-TYPE FIRST BUFFER LAYER) |
| 4 | FIRST ANNEALING STEP |
| 5 | ION IMPLANTATION STEP (FOR n-TYPE SECOND BUFFER LAYER) |
| 6 | SECOND ANNEALING STEP |
| 7 | ION IMPLANTATION STEP (FOR p-TYPE SECOND COLLECTOR LAYER) |
| 8 | ION IMPLANTATION STEP (FOR p-TYPE FIRST COLLECTOR LAYER) |
| 9 | THIRD ANNEALING STEP |
| 10 | LIGHT ETCHING |
| 11 | METAL FORMIMG |
| 12 | FOURTH ANNEALING STEP |

F I G. 1 5
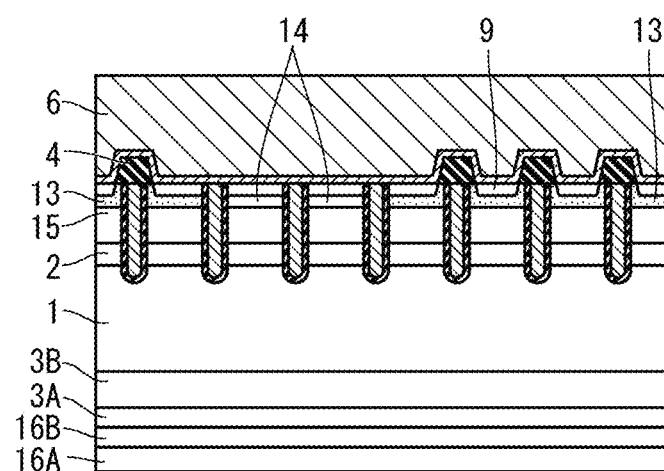

F I G. 1 6
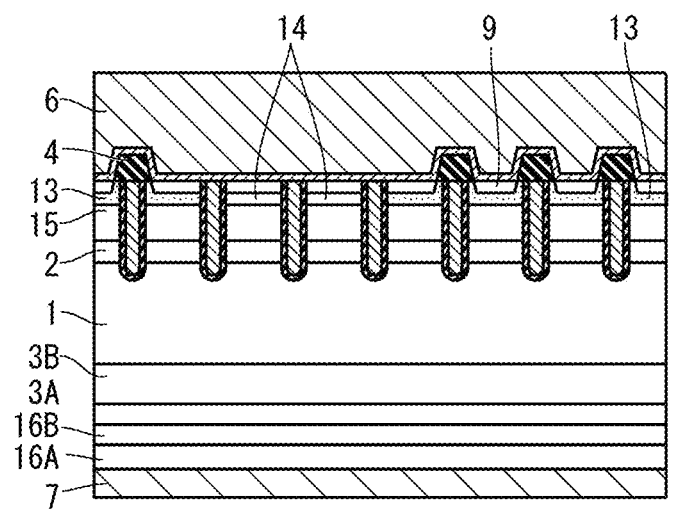

F I G. 1 8
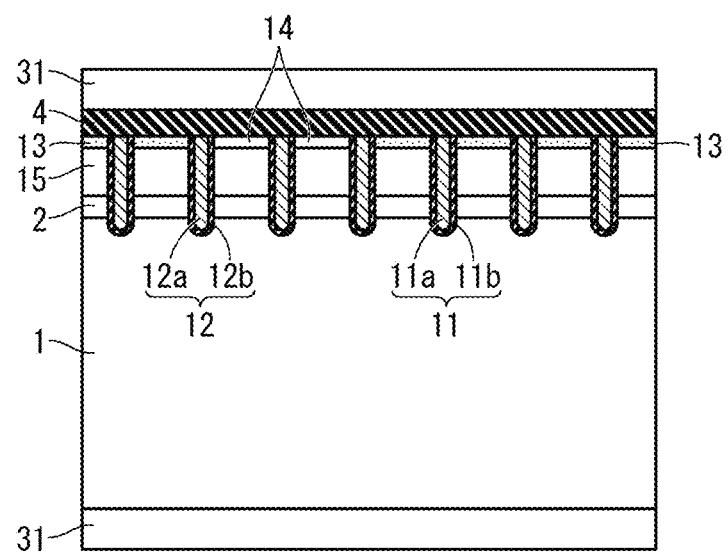

F I G. 1 9
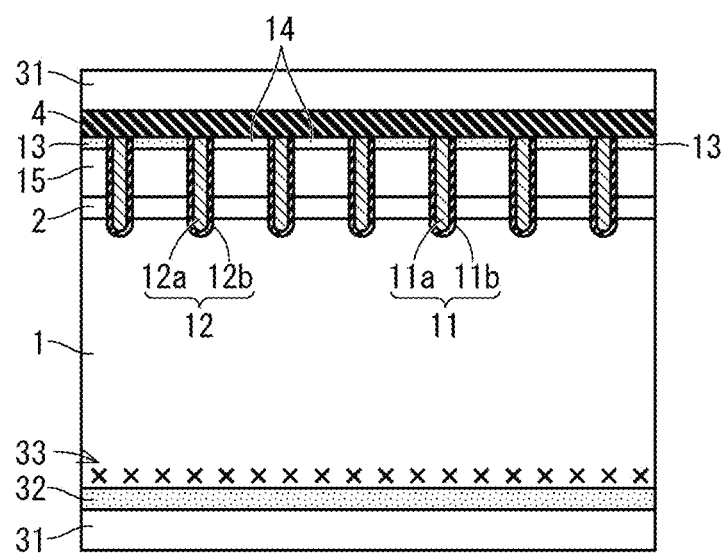

F I G. 2 0
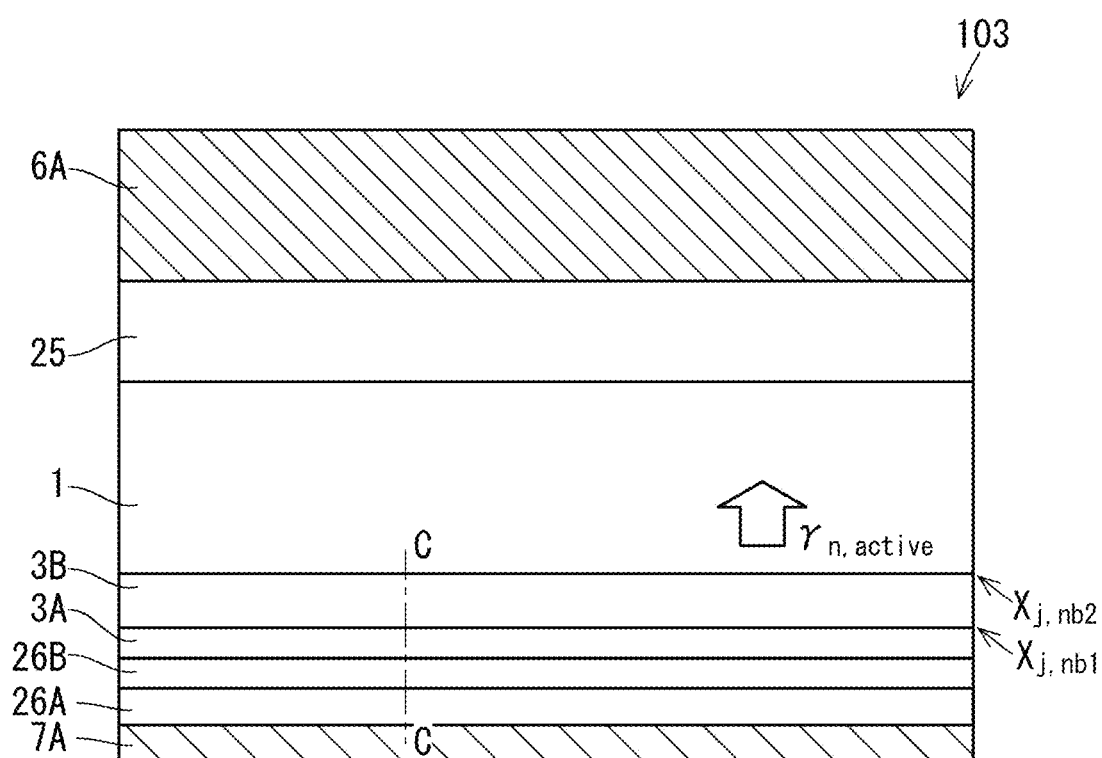

FIG. 21

| 1 | GRINDING |
|---|---|
| 2 | ETCHING |
| 3 | ION IMPLANTATION STEP (FOR n-TYPE FIRST BUFFER LAYER) |
| 4 | FIRST ANNEALING STEP |
| 5 | ION IMPLANTATION STEP (FOR n-TYPE SECOND BUFFER LAYER) |
| 6 | SECOND ANNEALING STEP |
| 7 | ION IMPLANTATION STEP (FOR $n^+$-TYPE SECOND CATHODE LAYER) |
| 8 | ION IMPLANTATION STEP (FOR $n^+$-TYPE FIRST CATHODE LAYER) |
| 9 | THIRD ANNEALING STEP |
| 10 | LIGHT ETCHING |
| 11 | METAL FORMING |
| 12 | FOURTH ANNEALING STEP |

F I G. 2 5
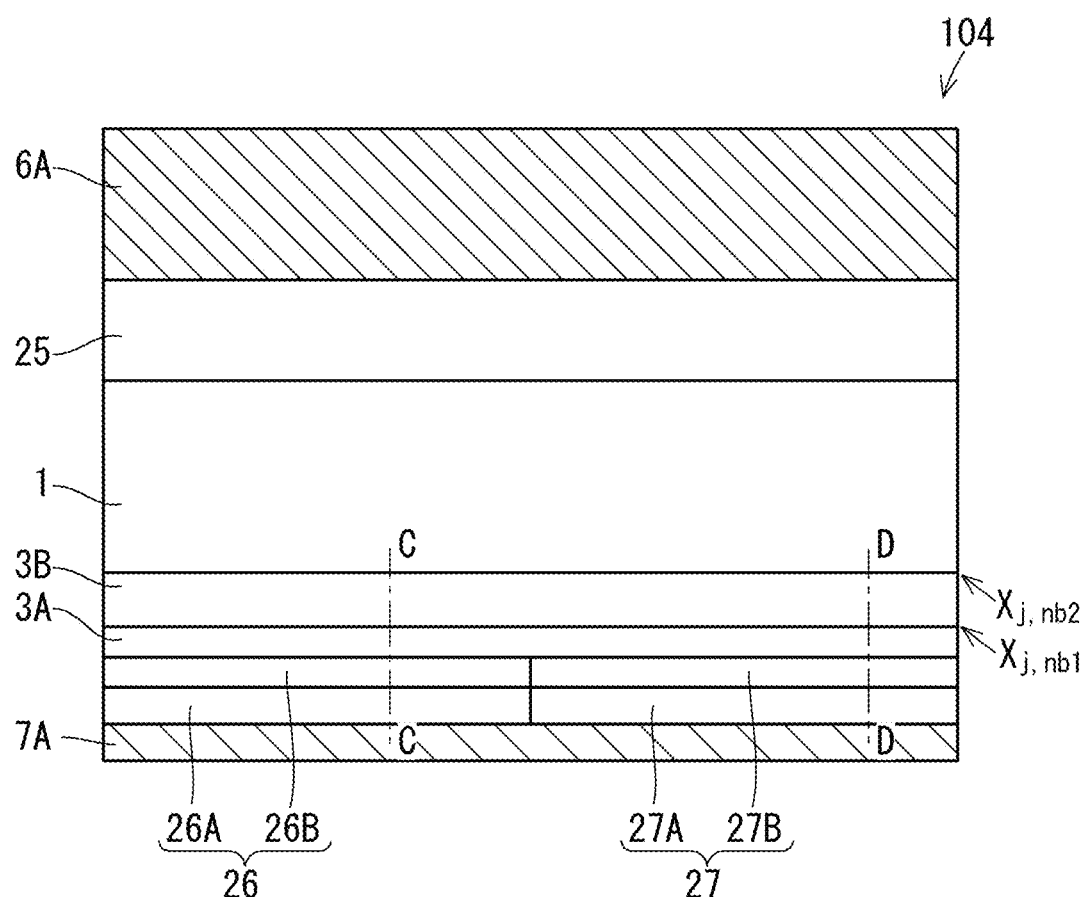

FIG. 26

| 1 | GRINDING |
|---|---|
| 2 | ETCHING |
| 3 | ION IMPLANTATION STEP (FOR n-TYPE FIRST BUFFER LAYER) |
| 4 | FIRST ANNEALING STEP |
| 5 | ION IMPLANTATION STEP (FOR n-TYPE SECOND BUFFER LAYER) |
| 6 | SECOND ANNEALING STEP |
| 7 | ION IMPLANTATION STEP (FOR p-TYPE SECOND CATHODE LAYER) |
| 8 | ION IMPLANTATION STEP (FOR p-TYPE FIRST CATHODE LAYER) |
| 9 | ION IMPLANTATION STEP (FOR n$^+$-TYPE SECOND CATHODE LAYER) |
| 10 | ION IMPLANTATION STEP (FOR n$^+$-TYPE FIRST CATHODE LAYER) |
| 11 | THIRD ANNEALING STEP |
| 12 | LIGHT ETCHING |
| 13 | METAL FORMING |
| 14 | FOURTH ANNEALING STEP |

F I G. 2 8

| 1 | GRINDING |
|---|---|
| 2 | ETCHING |
| 3 | ION IMPLANTATION STEP (FOR n-TYPE FIRST BUFFER LAYER) |
| 4 | FIRST ANNEALING STEP |
| 5 | ION IMPLANTATION STEP (FOR n-TYPE SECOND BUFFER LAYER) |
| 6 | SECOND ANNEALING STEP |
| 7 | ION IMPLANTATION STEP (FOR p-TYPE SECOND COLLECTOR LAYER) |
| 8 | ION IMPLANTATION STEP (FOR p-TYPE FIRST COLLECTOR LAYER) |
| 9 | ION IMPLANTATION STEP (FOR $n^+$-TYPE SECOND CATHODE LAYER) |
| 10 | ION IMPLANTATION STEP (FOR $n^+$-TYPE FIRST CATHODE LAYER) |
| 11 | THIRD ANNEALING STEP |
| 12 | LIGHT ETCHING |
| 13 | METAL FORMING |
| 14 | FOURTH ANNEALING STEP |

FIG. 31

| TYPE OF METAL | Ti | | AlSi | | NiSi | |
|---|---|---|---|---|---|---|
| CONDUCTIVITY TYPE OF DIFFUSION LAYER | n-type | p-type | n-type | p-type | n-type | p-type |
| CONTACT RESISTIVITY ($\Omega/cm^2$) | $3.0 \times 10^{-5}$ | (NO LINEAR REGION IN I-V CHARACTERISTICS) | $6.5 \times 10^{-4}$ | $6.0 \times 10^{-5}$ | $3.5 \times 10^{-4}$ | $1.4 \times 10^{-4}$ |

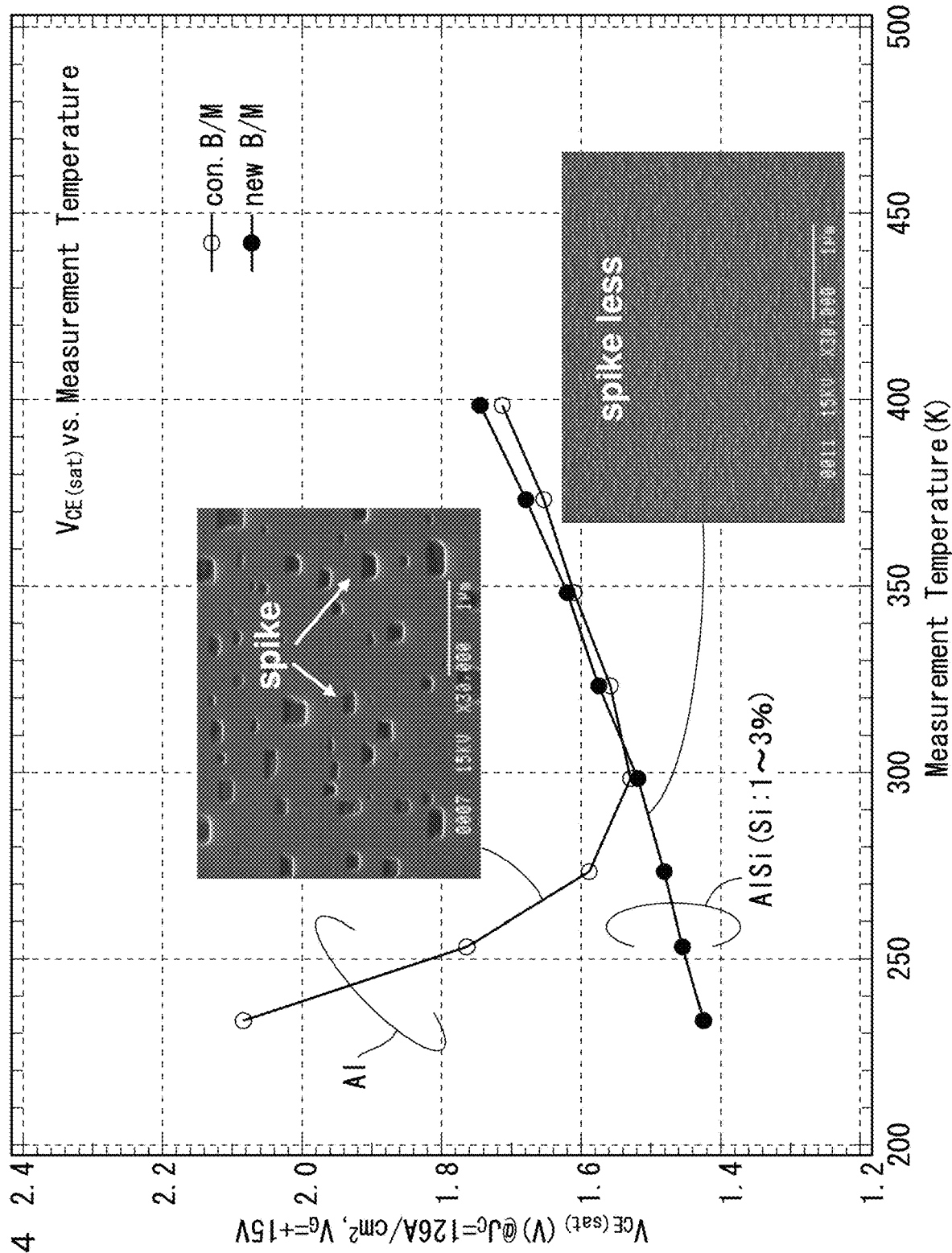
F I G. 34

SEMICONDUCTOR DEVICE AND METHOD FOR MANUFACTURING THE SAME

BACKGROUND OF THE INVENTION

Field of the Invention

The present disclosure relates to a semiconductor device and a method for manufacturing the semiconductor device.

Description of the Background Art

A semiconductor device such as an insulated gate bipolar transistor (IGBT) exhibits a trade-off characteristic with respect to a relationship between an ON voltage and a switching loss. In order to control the trade-off relationship, a carrier lifetime control method for intentionally generating a recombination center in a semiconductor substrate is known. The recombination center is generated, for example, by injecting charged particles such as electron beams, protons, and helium, or heavy metals such as platinum into the semiconductor substrate.

On the other hand, Japanese Patent Application Laid-Open No. 2004-311481 discloses an IGBT that includes a P emitter layer including a $P^-$ layer having a concentration similar to that of an N buffer layer and a $P^+$ layer having a high concentration in contact with the $P^-$ layer. The IGBT described in Japanese Patent Application Laid-Open No. 2004-311481 achieves reduction in the ON voltage without increasing the turn-off loss while increasing the reverse withstand voltage.

The $P^-$ layer described in Japanese Patent Application Laid-Open No. 2004-311481 has a function of preventing a collector short circuit due to a defect or the like and supporting the $P^+$ layer. Therefore, it is difficult to control the relationship between the ON voltage and the switching loss to any characteristic.

SUMMARY

The present disclosure is intended to solve the above problem, and provides a semiconductor device capable of controlling a trade-off characteristic between an ON voltage and a switching loss.

A semiconductor device according to the present disclosure includes a semiconductor substrate, a drift layer of a first conductivity type, a buffer layer of the first conductivity type, a first semiconductor layer, and a second semiconductor layer. The semiconductor substrate includes a first main surface and a second main surface opposite to the first main surface. The drift layer of the first conductivity type is provided between the first main surface and the second main surface of the semiconductor substrate. The buffer layer of the first conductivity type is provided on the second main surface side with respect to the drift layer. The buffer layer of the first conductivity type has a larger number of atoms of impurities per unit volume than the drift layer. The first semiconductor layer and the second semiconductor layer are provided on the second main surface side with respect to the buffer layer. The first semiconductor layer and the second semiconductor layer are arranged in this order in a direction from the second main surface toward the first main surface. The first semiconductor layer and the second semiconductor layer have conductivity types identical to each other. The second semiconductor layer has a larger number of atoms of impurities per unit volume than the first semiconductor layer.

The semiconductor device of the present disclosure makes it possible to control a trade-off characteristic between an ON voltage and a switching loss.

The objects, features, aspects, and advantages of the present disclosure will become more apparent from the following detailed description and the accompanying drawings.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 7 is a diagram showing a method for manufacturing a semiconductor device;

FIG. 8 is a diagram showing a method for manufacturing a semiconductor device;

FIG. 10 is a diagram showing a method for manufacturing a semiconductor device;

FIG. 11 is a diagram showing a method for manufacturing a semiconductor device;

FIG. 12 is a diagram showing a method for manufacturing a semiconductor device;

FIG. 14 is a diagram showing a list of steps of forming the structure on the second main surface side of the semiconductor device;

FIG. 15 is a diagram showing a method for manufacturing a semiconductor device;

FIG. 16 is a diagram showing a method for manufacturing a semiconductor device;

FIG. 18 is a diagram showing a method for manufacturing a semiconductor device;

FIG. 19 is a diagram showing a method for manufacturing a semiconductor device;

FIG. 20 is a diagram showing a configuration of a semiconductor device in a third preferred embodiment;

FIG. 21 is a diagram showing a list of steps of forming the structure on the second main surface side of the semiconductor device;

FIG. 25 is a cross-sectional view showing the configuration of the semiconductor device in a fourth preferred embodiment;

FIG. 26 is a diagram showing a list of steps of forming the structure on the second main surface side of the semiconductor device;

FIG. 28 is a diagram showing a list of steps of forming the structure on the second main surface side of the semiconductor device;

FIG. 31 is a diagram showing the type of metal, the conductivity type of the diffusion layer, and the contact resistivity;

FIG. 34 is a diagram showing a relationship between an ON voltage and a measurement temperature in an IGBT.

DESCRIPTION OF THE PREFERRED EMBODIMENTS

First Preferred Embodiment

In the following description, n and p represent the conductivity type of the semiconductor. The n$^-$ indicates that the impurity concentration is lower than that of n. The n$^+$ indicates that the impurity concentration is higher than that of n. Similarly, the p$^-$ indicates that the impurity concentration is lower than that of p. The p$^+$ indicates that the impurity concentration is higher than that of p. The p-type and n-type of each layer described below may be interchanged with each other. Here, the impurity concentration indicates the number of atoms of impurities per unit volume, and the unit is represented by "atoms/cm$^3$". In the following preferred embodiments, "atoms/cm$^2$" is used in addition to the unit or "atoms/cm$^3$". The "atoms/cm$^2$" indicates the number of atoms per unit area. The number of atoms per unit area (atoms/cm$^2$) corresponds to a value obtained by integrating the number of atoms per unit volume (atoms/cm$^3$) in the depth direction. The number of atoms per unit volume (atoms/cm$^3$) is determined by secondary ion mass spectrometry (SIMS), for example.

Figure 1:
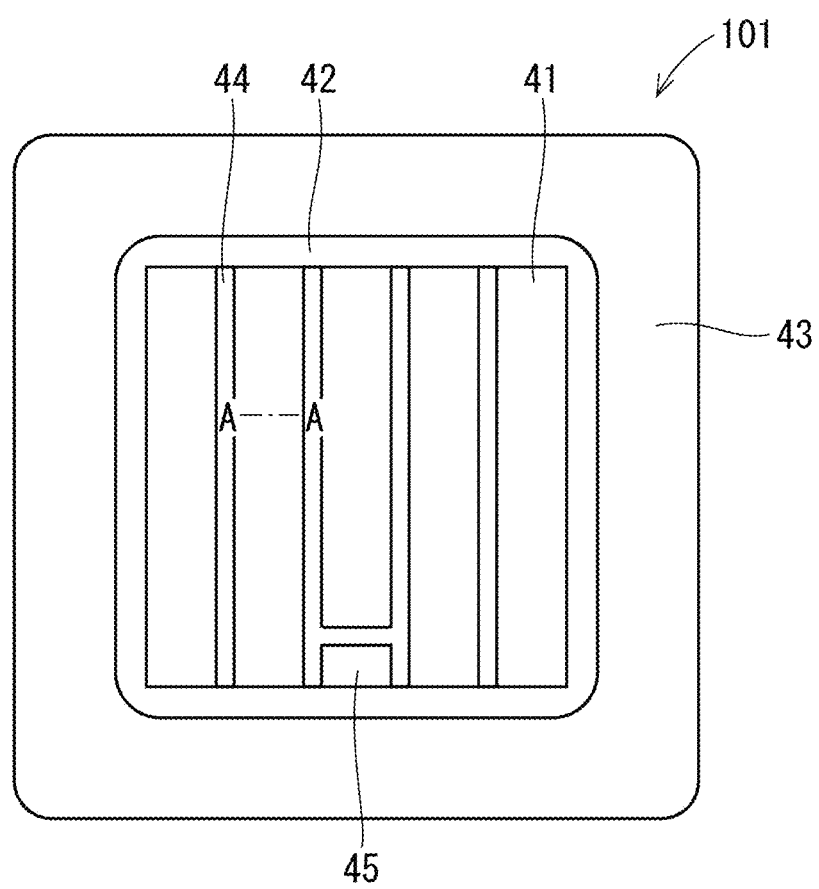
FIG. 1 is a plan view showing the configuration of a semiconductor device in a first preferred embodiment.

FIG. 1 is a plan view showing the configuration of the semiconductor device 101 in the first preferred embodiment. The semiconductor device 101 includes an active cell region 41, an interface region 42, an edge termination region 43, a gate wiring line 44, and a gate pad 45 in one semiconductor substrate. The semiconductor substrate is formed of, for example, a semiconductor such as Si, or what is called a wide bandgap semiconductor such as SiC, GaN, or gallium oxide. In the first preferred embodiment, an example in which the semiconductor substrate is a Si wafer is shown, but the type of the semiconductor substrate is not limited thereto as described above. The semiconductor device 101 in the first preferred embodiment is an insulated gate bipolar transistor (IGBT) having a trench gate structure.

In the active cell region 41, a plurality of IGBT cells (not shown) are arranged. The active cell region 41 is a region that ensures the basic performance of the semiconductor device 101.

The interface region 42 is a region between the active cell region 41 and the edge termination region 43, and is a region that plays a role of supporting the improvement in the breakdown tolerance during the dynamic operation of the IGBT. The interface region 42 is a region that supports the original performance of the active cell region 41.

The edge termination region 43 holds a withstand voltage in a static state. The edge termination region 43 is a region that plays a role of ensuring the stability and reliability of the withstand voltage characteristics, and ensuring the breakdown tolerance during the dynamic operation. The edge termination region 43 is a region that supports the original performance of the active cell region 41.

Figure 2:
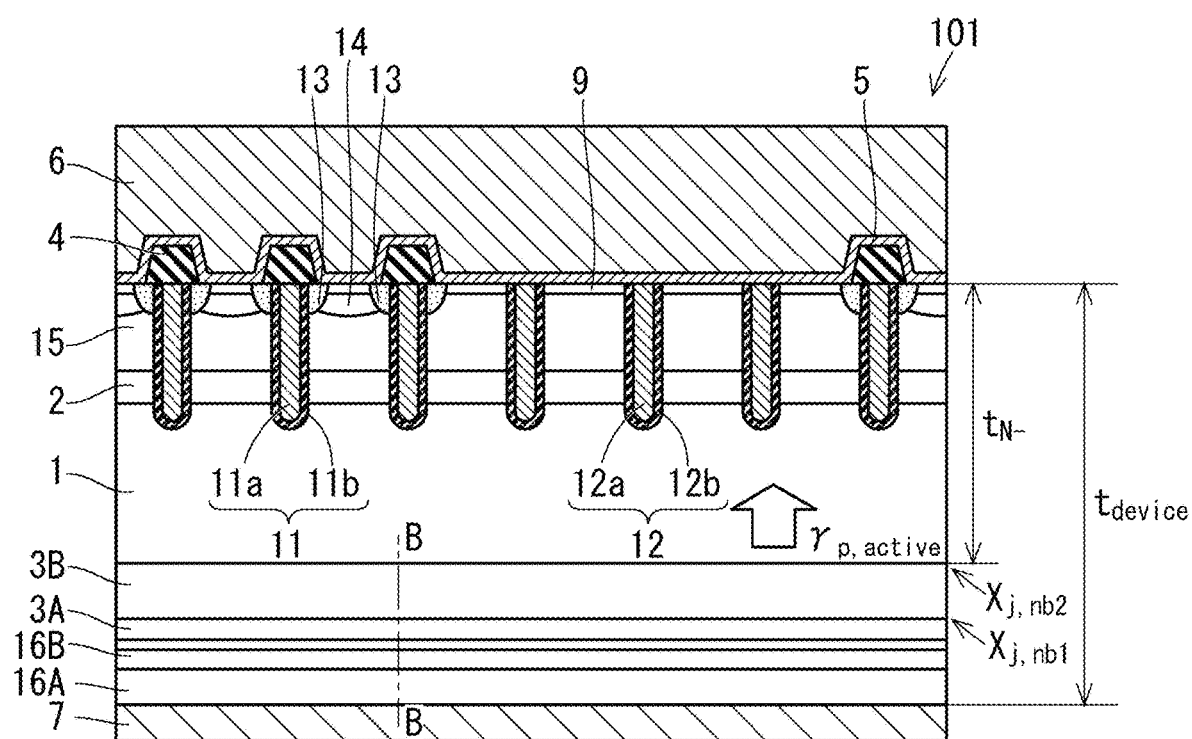
FIG. 2 is a cross-sectional view showing the configuration of the semiconductor device in the first preferred embodiment.
Figure 3:
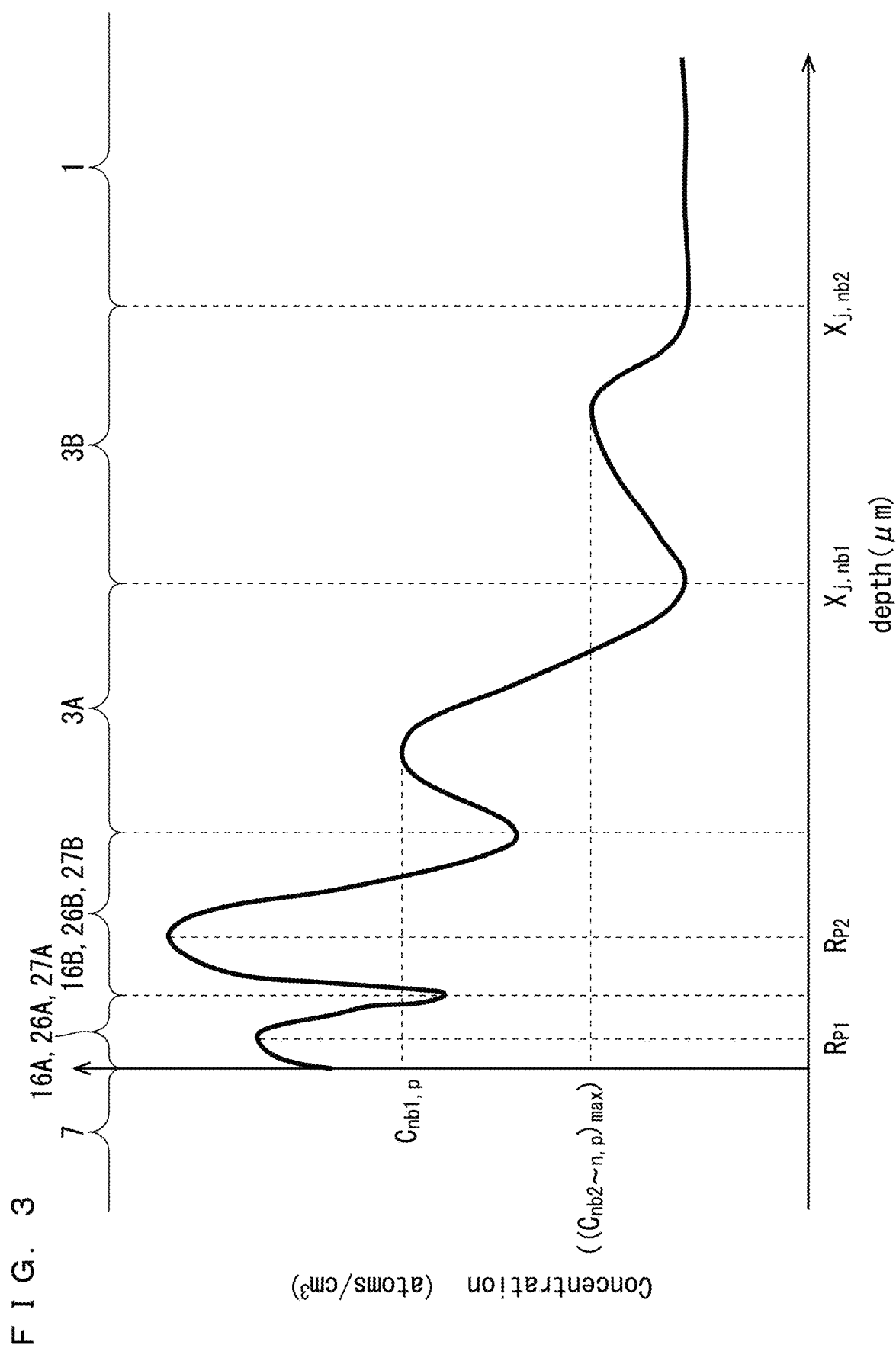
FIG. 3 is a diagram showing a profile of an impurity concentration along line B-B shown in FIG. 2.

FIG. 2 is a cross-sectional view showing a configuration of an active cell region 41 of the semiconductor device 101 in the first preferred embodiment. FIG. 2 shows a cross section taken along line A-A shown in FIG. 1. FIG. 3 is a diagram showing a profile of the impurity concentration along line B-B, that is, in the depth direction, shown in FIG. 2. In FIG. 3, the impurity concentration is indicated by the number of atoms of the impurities per unit volume (atoms/cm$^3$).

The semiconductor device 101 includes an n$^+$-type emitter layer 13, a p$^+$-type contact layer 14, a p-type base layer 15, an n-type carrier accumulation layer 2, an n$^-$-type drift layer 1, an n-type first buffer layer 3A, an n-type second buffer layer 3B, as p-type first collector layer 16A, a p-type second collector layer 16B, a silicide layer 9, an interlayer insulating film 4, a barrier metal 5, an emitter electrode 6, a collector electrode 7, an active trench gate 11, and a dummy trench gate 12. The IGBT cell corresponds to, for example, a region divided for each active trench gate 11.

In the above structure, the n$^+$-type emitter layer 13, the p$^+$-type contact layer 14, the p-type base layer 15, the n-type carrier accumulation layer 2, the n$^-$-type drift layer 1, the n-type first buffer layer 3A, the n-type second buffer layer 3B, the p-type first collector layer 16A, and the p-type second collector layer 16B are provided between the first main surface and the second main surface of the semiconductor substrate. The first main surface corresponds to the upper surface of the semiconductor substrate, and the second main surface is a surface opposite to the first main surface and corresponds to the lower surface of the semiconductor substrate. The first main surface side and the second main surface side correspond to what is called a front side and a back side, respectively.

In the first preferred embodiment, the first main surface corresponds to the front surfaces (upper surfaces) of the n$^+$-type emitter layer 13 and the p$^+$-type contact layer 14. The second main surface corresponds to the front surface (lower surface) of the p-type first collector layer 16A. In other words, in the IGBT cell, the semiconductor substrate corresponds to a range from the upper surface of the n$^+$-type emitter layer 13 or the p$^+$-type contact layer 14 to the lower surface of the p-type first collector layer 16A. The thickness ($t_{device}$) of the semiconductor substrate is 40 μm or more and 700 μm or less.

The n$^-$-type drift layer 1 is formed as an inner layer of the semiconductor substrate. The n$^-$-type drift layer 1 is a semiconductor layer containing, for example, arsenic (As) or phosphorus (P) as n-type impurities. The concentration ($C_{n-}$) of the n-type impurities is preferably 1.0E+12 atoms/cm$^3$ or more and 5.0E+14 atoms/cm$^3$ or less.

The n-type carrier accumulation layer 2 is provided on the first main surface side of the semiconductor substrate with respect to the n⁻-type drift layer 1. The n-type carrier accumulation layer 2 is a semiconductor layer containing, for example, arsenic, phosphorus, or the like as n-type impurities. The n-type carrier accumulation layer 2 has a higher concentration of n-type impurities than the n⁻-type drift layer 1. The peak concentration of the n-type impurities is preferably 1.0E+15 atoms/cm³ or more and 1.0E+17 atoms/cm³ or less.

The p-type base layer 15 is provided on the first main surface side of the semiconductor substrate with respect to the n-type carrier accumulation layer 2. The main joint surface between the p-type base layer 15 and the n-type carrier accumulation layer 2 is preferably positioned at a depth larger than the n⁺-type emitter layer 13 and smaller than the n-type, carrier accumulation layer 2 from the first main surface. The p-type base layer 15 is a semiconductor layer containing, for example, boron (B), aluminum (Al), or the like as p-type impurities. The peak concentration of the p-type impurities is preferably 1.0E+16 atoms/cm³ or more and 1.0E+18 atoms/cm⁻ or less.

The n⁺-type emitter layer 13 is provided on the first main surface side of the semiconductor substrate with respect to the p-type base layer 15. The n⁺-type emitter layer 13 is selectively provided on the upper surface side of the p-type base layer 15 as a surface layer of the semiconductor substrate. The n⁺-type emitter layer 13 in the first preferred embodiment is selectively provided on both sides of the active trench gate 11. The joint surface between the n⁺-type emitter layer 13 and the p-type base layer 15 is preferably positioned at a depth of 0.2 μm or more and 1.0 μm or less from the first main surface. The n⁺-type emitter layer 13 is a semiconductor layer containing, for example, arsenic, phosphorus, or the like as n-type impurities. The peak concentration of the n-type impurities is preferably 1.0E+18 atoms/cm³ or more and 1.0E+21 atoms/cm³ or less.

The p⁺-type contact layer 14 is provided on the first main surface side of the semiconductor substrate with respect to the p-type base layer 15. The p⁺-type contact layer 14 is selectively provided on the upper surface side of the p-type base layer 15 as a surface layer of the semiconductor substrate. The p⁺-type contact layer 14 in the first preferred embodiment is arranged so as to be sandwiched between the n⁺-type emitter layers 13. The p⁺-type contact layer 14 is provided up to the same depth as the n⁺-type emitter layer 13 or up to a position deeper than the n⁺-type emitter layer 13. The p⁺-type contact layer 14 is a semiconductor layer containing, for example, boron, aluminum, or the like as p-type impurities. The peak concentration of the p-type impurities is preferably 1.0E+18 atoms/cm³ or more and 1.0E+21 atoms/cm³ or less.

The n-type first buffer layer 3A and the n-type second buffer layer 3B are provided on the second main surface side of the semiconductor substrate with respect to the n⁻-type drift layer 1. The n-type first buffer layer 3A and the n-type second buffer layer 3B are arranged in this order in a direction from the second main surface toward the first main surface (upward direction in FIG. 2). The interface ($X_{j,\,nb1}$) between the n-type first buffer layer 3A and the n-type second buffer layer 3B is preferably positioned at a depth of 1.2 μm or more and 5.0 μm or less from the second main surface. The interface ($X_{j,\,nb2}$) between the n-type second buffer layer 3B and the n⁻-type drift layer 1 is preferably positioned at a depth of 4.0 μm or more and 50 μm or less from the second main surface.

The n-type first buffer layer 3A is a semiconductor layer containing phosphorus or arsenic as n-type impurities. The n-type second buffer layer 3B is a semiconductor layer containing elements other than phosphorus and arsenic as n-type impurities. The n-type second buffer layer 3B is a semiconductor layer containing, for example, selenium, sulfur, protons (H⁺), or helium. The concentration of n-type impurities in the n-type first buffer layer 3A and the n-type second buffer layer 3B is higher than that of the n⁻-type drift layer 1. The peak concentration ($C_{nb1,\,p}$) of the n-type impurities in the n-type first buffer layer 3A is preferably 1.0E+16 atoms/cm³ or more and 5.0E+16 atoms/cm³ or less. The maximum peak concentration ($C_{nb2-n,\,p})_{max}$ of the n-type impurities in the n-type second buffer layer 3B is higher than the concentration ($C_{n-}$) of the n-type impurities in the n⁻-type drift layer 1, and is 1.0E+15 atoms/cm or less.

The p-type first collector layer 16A and the p-type second collector layer 16B are provided on the second main surface side of the semiconductor substrate with respect to the n-type first buffer layer 3A. The p-type first collector layer 16A and the p-type second collector layer 16B are arranged in this order in a direction from the second main surface toward the first main surface. The interface between the p-type first collector layer 16A and the p-type second collector layer 16B is preferably positioned at a depth of 0.1 μm from the second main surface. The interface between the p-type second collector layer 16B and the n-type first buffer layer 3A is preferably positioned at a depth of 0.3 μm or more and 0.8 μm or less from the second main surface.

The p-type first collector layer 16A and the p-type second collector layer 16B are semiconductor layers containing, for example, boron, aluminum, BF₂, or the like as p-type impurities. The concentration of the p-type impurities on the front surface of the p-type first collector layer 16A, that is, the second main surface is preferably 1.0E+17 atoms/cm³ or more and 1.0E+18 atoms/cm³ or less. The peak concentration of the p-type impurities in the p-type second collector layer 16B is preferably 1.0E+16 atoms/cm³ or more and 1.0E+20 atoms/cm³ or less.

The peak concentration ($C_{nb1,\,p}$) of the n-type impurities in the n-type first buffer layer 3A is lower than the peak concentration of the p-type impurities in the p-type second collector layer 16B and the peak concentration of the p-type impurities in the p-type first collector layer 16A.

The depth ($R_{P1}$) from the second main surface where the peak of the concentration of the p-type impurities in the p-type first collector layer 16A is positioned and the depth ($R_{P2}$) from the second main surface where the peak of the concentration of the p-type impurities in the p-type second collector layer 16B is positioned preferably satisfy the following formula (1).

$$R_{P2}/R_{P1}=5.0 \tag{1}$$

The number of atoms of the p-type impurities per unit area ($D_{P1}$) in the p-type first collector layer 16A and the number of atoms of the p-type impurities per unit area ($D_{P2}$) in the p-type second collector layer 16B preferably satisfy the following formula (2).

$$D_{P2}/D_{P1} \geq 0.07 \tag{2}$$

The p-type first collector layer 16 has a function of improving the contact property with the collector electrode 7. The p-type second collector layer 16 has a function of controlling carrier injection efficiency ($\gamma_{p,\,active}$ in FIG. 2) from the second main surface side by the number of atoms of p-type impurities per unit area. The p-type first collector layer 16A and the p-type second collector layer 16B satisfy the formulas (1) and (2), whereby mutual interference is prevented, and the respective functions are achieved. The impurity profile and depth of the p-type first collector layer 16A and the p-type second collector layer 16B are controlled by a range, an annealing temperature, and the like at the time of ion implantation to be described below.

The active trench gate 11 and the dummy trench gate 12 extend in the depth direction in FIG. 2.

The active trench gate 11 penetrates the d-type emitter layer 13, the p-type base layer 15, and the n-type carrier accumulation layer 2 from the first main surface of the semiconductor substrate, and reaches the n$^-$-type drift layer 1. The depth of the active trench gate 11 is, for example, 2.0 μm or more from the first main surface. The active trench gate 11 includes a gate trench insulating film 11b and a gate trench electrode 11a.

The gate trench insulating film 11b is formed along the inner wall of the trench formed in the depth direction from the first main surface (upper surface) of the semiconductor substrate. The gate trench insulating film 11b is, for example, an oxide film.

The gate trench electrode 11a is formed inside the trench with the interposition of the gate trench insulating film 11b. The gate trench electrode 11a is formed of, for example, conductive poly silicon. The gate trench electrode 11a is electrically connected to the gate pad 45 by the gate wiring line 44. Application of a gate drive voltage to the gate trench electrode 11a forms a channel in the p-type base layer 15 in contact with the gate trench insulating film 11b.

The dummy trench gate 12 penetrates the p-type base layer 15 and the n-type carrier accumulation layer 2 from the first main surface of the semiconductor substrate and reaches the n-type drift layer 1. The depth of the dummy trench gate 12 is the same as that of the active trench gate 11. The dummy trench gate 12 includes a dummy trench insulating film 12b and a dummy trench electrode 12a.

The configurations of the dummy trench insulating film 12b and the dummy trench electrode 12a are similar to the configurations of the gate trench insulating film 11b and the gate trench electrode 11a, respectively. However, the dummy trench electrode 12a is electrically connected to the emitter electrode 6 to be provided above the first main surface of the semiconductor device 101.

In the region where the dummy trench gate 12 is formed, the dummy trench electrode 12a and the emitter electrode 6 have the same potential. This region suppresses the saturation current density of the IGBT. In addition, this region suppresses oscillation under a no-load short-circuit state due to the capacitance characteristic control. Therefore, the short circuit tolerance is improved. The carrier concentration on the emitter electrode 6 side in the ON state of the IGBT is improved, and the ON voltage decreases.

The interlayer insulating film 4 is provided on the gate trench electrode 11a of the active trench gate 11.

The barrier metal 5 is formed so as to cover a region where the interlayer insulating film 4 is not provided in the first main surface of the semiconductor substrate, and the interlayer insulating film 4. The barrier metal 5 is formed of, for example, a metal containing titanium, such as Ti, TiN, or TiW. However, the metal used for the barrier metal 5 is not limited to a metal containing titanium. The barrier metal 5 may be formed of a metal such as tungsten (W), cobalt (Co), platinum (Pt), or nickel (Ni). The barrier metal 5 is in ohmic contact with the n$^+$-type emitter layer 13, the p$^+$-type contact layer 14, and the dummy trench electrode 12a with the interposition of the silicide layer 9, and is electrically connected thereto.

The silicide layer 9 is formed on a surface layer of a region where the interlayer insulating film 4 is not provided in the first main surface of the semiconductor substrate. The silicide layer 9 is formed, for example, by reacting with a metal constituting the barrier metal 5 in the manufacturing step. When the barrier metal 5 is Ti, Co, W, Pt, or Ni, the silicide layer 9 is formed as $TiSi_2$, $CoSi_2$, WSi, PtSi, NiSi, or $NiSi_2$, respectively.

The emitter electrode 6 is provided on the barrier metal 5. The emitter electrode 6 is preferably formed of, for example, an aluminum alloy (Al—Si-based alloy) containing aluminum and silicon. The emitter electrode 6 is electrically connected to the n$^+$-type emitter layer 13, the p$^+$-type contact layer 14, and the dummy trench electrode 12a with the interposition of the barrier metal 5.

The collector electrode 7 is provided on the p-type first collector layer 16A. The collector electrode 7 has, for example, a configuration (not shown) in which a plurality of metal layers are stacked. Of the plurality of metal layers, the metal layer in contact with the p-type first collector layer 16A is formed of AlSi or NiSi. When the metal layer is formed of AlSi, the concentration of Si contained in the AlSi is preferably 1% or more and 3% or less. The collector electrode 7 is in ohmic contact with the p-type first collector layer 16A and is electrically connected thereto.

Figure 4:
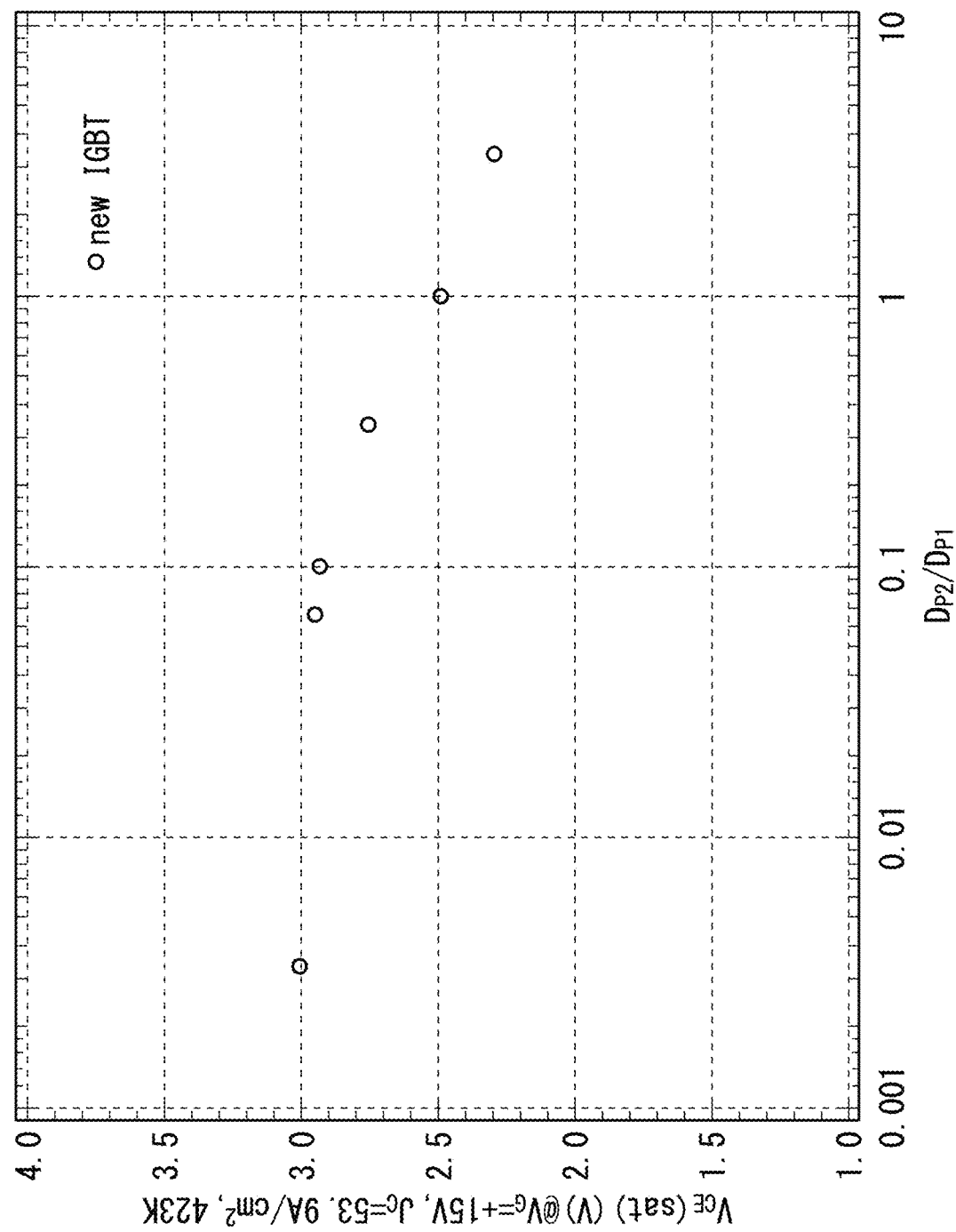
FIG. 4 is a diagram showing a relationship between an ON voltage and a ratio of the number of atoms of impurities per unit area in p-type collector layers.

FIG. 4 is a diagram showing a relationship between the ON voltage ($V_{CE}$(sat)) of the semiconductor device 101 and the ratio ($D_{P2}/D_{P1}$) of the number of atoms of the p-type impurities per unit area in the p-type first collector layer 16A and the p-type second collector layer 16B in the first preferred embodiment. It is shown that when the ratio of the number of atoms of the p-type impurities ($D_{P2}/D_{P1}$) is 0.07 or more, the ON voltage of the semiconductor device 101 can be controlled to various values by the ratio of the number of atoms ($D_{P2}/D_{P1}$). Therefore, the range of the p-type impurities is set in the ion implantation step for forming the p-type first collector layer 16A and the p-type second collector layer 16B so that such a ratio of the number of atoms is achieved.

Figure 5:
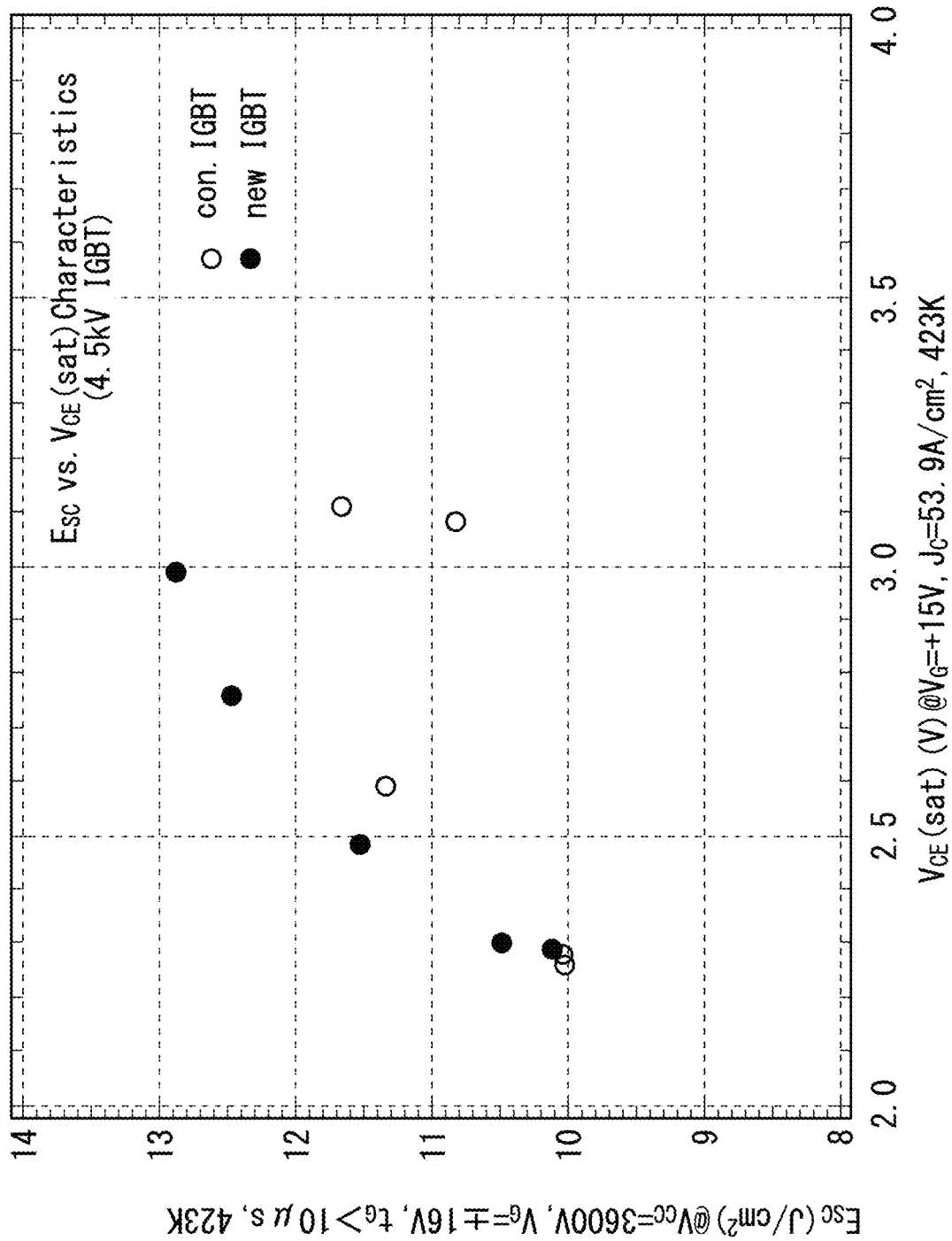
FIG. 5 is a diagram showing a relationship between a short-circuit energy density and an ON voltage.

FIG. 5 is a diagram showing a relationship between the short-circuit energy density ($E_{SC}$) and the ON voltage ($V_{CE}$(sat)) of the semiconductor device 101 in the first preferred embodiment. The short-circuit energy density indicates the maximum interruption energy in the short-circuit state. The "con. IGBT" indicates an IGBT as a comparative example. A carrier lifetime control method is applied to the IGBT of the comparative example. In addition, the p-type contact layer of the IGBT of the comparative example is a single layer (that is, having one peak of the p-type impurity concentration). The "new IGBT" indicates the semiconductor device 101 in the first preferred embodiment. That is, the "new IGBT" includes the p-type first collector layer 16A and the p-type second collector layer 16B described above, and the carrier lifetime control method is not applied to the "new IGBT".

When the semiconductor device 101 is in the short-circuit state, the carrier concentration on the second main surface side (back-side side) increases. The electric field intensity extending from the main joint surface between the p-type base layer 15 and the n-type carrier accumulation layer 2 toward the second main surface is reduced on the back-side side. Therefore, the short-circuit energy density of the semiconductor device 101 for a certain ON voltage is higher than the short-circuit energy density of the IGBT of the comparative example.

Figure 6:
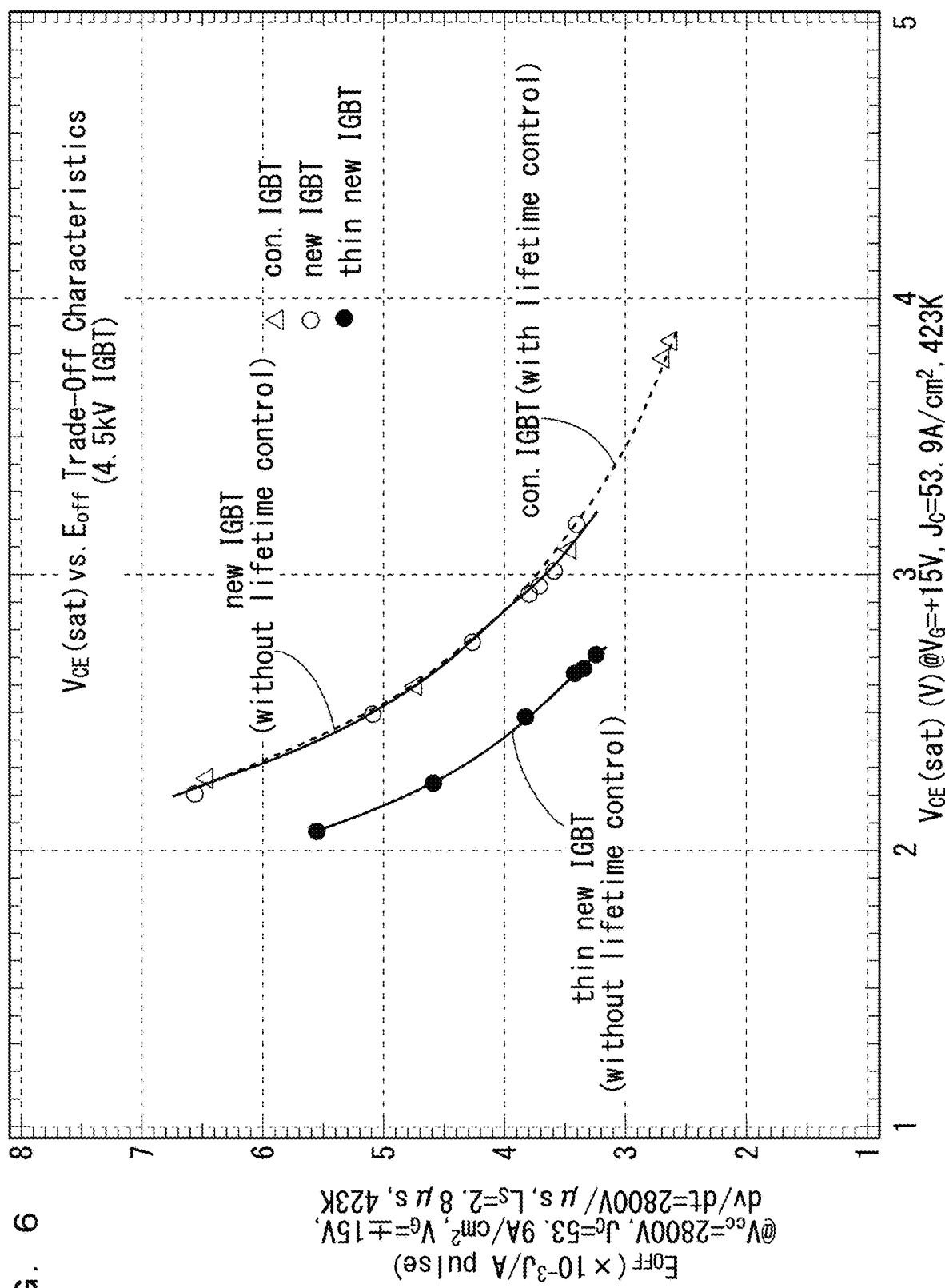
FIG. 6 is a diagram showing a relationship between an ON voltage and a turn-off switching loss.

FIG. 6 is a diagram showing a relationship between an ON voltage ($V_{CE}$(sat)) and a turn-off switching loss ($E_{OFF}$).

The ON voltage and the turn-off switching loss indicate trade-off characteristics. Similarly to FIG. 5, the "con. IGBT" and the "new IGBT" respectively indicate an IGBT as a comparative example and a semiconductor device 101 as a preferred embodiment. The "thin new IGBT" indicates the characteristic of the semiconductor device 101 when the thickness ($t_{device}$) of the semiconductor substrate is thin. The trade-off characteristic of the "con. IGBT" is controlled by a carrier lifetime control method. Each of the trade-off characteristics of the "new IGBT" and the "thin new IGBT" is controlled by the number of atoms ($D_{P2}$) of the p-type impurities per unit area of the p-type second collector layer 16B constituting the p-type collector layer.

The characteristic of the turn-off switching loss with respect to the ON voltage in the semiconductor device 101 shows a characteristic similar to the characteristic in the comparative example. That is, the semiconductor device 101 can control the trade-off characteristic using the p-type first collector layer 16A and the p-type second collector layer 16B even without applying the carrier lifetime control method. The control of the trade-off characteristic includes, for example, adjusting the turn-off switching loss in order to achieve a desired ON voltage, or adjusting the ON voltage in order to achieve a desired turn-off switching loss.

As shown in FIG. 5, the "new IGBT" produces an effect of improving the $E_{SC}$. This effect can be utilized for shrinkage of the thickness ($t_{device}$) of the substrate. The ON voltage, turn-off switching loss, and ESC of the IGBT depend on the substrate thickness ($t_{device}$). When the thickness ($t_{device}$) of the substrate shrinks, the $E_{SC}$ decreases although the ON voltage and the turn-off switching loss decrease. Therefore, if there is an effect of improving the ESC, the effect can be used to shrink the thickness ($t_{device}$) of the substrate, and can be diverted to the effect of reducing the ON voltage and the turn-off switching loss. As a result, when the thickness ($t_{device}$) of the semiconductor substrate is reduced, both the ON voltage and the turn-off switching loss are reduced, and the performance of the semiconductor device 101 is improved. In other words, when the thickness ($t_{device}$) of the semiconductor substrate is reduced, the relationship between the ON voltage and the turn-off switching loss can be controlled by the number of atoms per unit area of the p-type second collector layer 16B, and the trade-off characteristic can be controlled.

To summarize the above, the semiconductor device 101 in the first preferred embodiment includes a semiconductor substrate, an n-type first buffer layer 3A, a p-type first collector layer 16A, and a p-type second collector layer 16B. The semiconductor substrate includes a first main surface, a second main surface opposite to the first main surface, and an n⁻-type drift layer provided between the first main surface and the second main surface. The n-type first buffer layer 3A is provided on the second main surface side with respect to the n⁻-type drift layer 1. The n-type first buffer layer 3A has a larger number of atoms of n-type impurities per unit volume than the n⁻-type drift layer 1. The p-type first collector layer 16A and the p-type second collector layer 16B are provided on the second main surface side with respect to the n-type first buffer layer 3A. The p-type first collector layer 16A and the p-type second collector layer 16B are arranged in this order in a direction from the second main surface toward the first main surface. The p-type first collector layer 16A and the p-type second collector layer 16B have conductivity types identical to each other. The p-type second collector layer 16B has a larger number of atoms of p-type impurities per unit volume than the p-type first collector layer 16A. The number of atoms of the p-type impurities per unit area ($D_{P1}$) in the p-type first collector layer 16A and the number of atoms of the p-type impurities per unit area ($D_{P2}$) in the p-type second collector layer 16B preferably satisfy the formula (2).

This semiconductor device 101 can control a trade-off characteristic between an ON voltage and a switching loss.

When the carrier lifetime control method is applied, charged particles, heavy metals, and the like are injected into the semiconductor substrate. The charged particles, heavy metals, and the like form complex defects with impurities contained in the semiconductor substrate. Here, the impurities contained in the semiconductor substrate are atoms that enter the semiconductor substrate in a manufacturing step of the semiconductor substrate. For example, when the semiconductor substrate is a Si wafer manufactured by a floating zone (FZ) method or a magnetic field applied Czochralski (MCZ) method, oxygen or carbon enters as a defect. For example, a Si wafer manufactured by the MCZ method contains oxygen atoms of about 1.0E+17 to 7.0E+17 atoms/cm³ and carbon atoms of about 1.0E+14 to 5.0E+15 atoms/cm³.

In the semiconductor device 101 in the first preferred embodiment, the carrier lifetime control method is unnecessary in controlling the trade-off characteristic between the ON voltage and the switching loss. Therefore, complex defects caused by the carrier lifetime control method are not formed in the semiconductor substrate. Regardless of the type of Si wafer, the trade-off characteristic between the ON voltage and the switching loss is accurately controlled by the p-type first collector layer 16A and the p-type second collector layer 16B formed so as to satisfy the relationship of formula (2). Therefore, a high-performance IGBT is achieved.

As described above, the semiconductor substrate is not limited to the Si wafer. The above effect is also produced for a compound semiconductor substrate such as SiC, GaN, or gallium oxide.

In the first preferred embodiment, an example has been shown in which the semiconductor device 101 includes the n-type first buffer layer 3A and the n-type second buffer layer 3B. The n-type first buffer layer 3A and the n-type second buffer layer 3B may be defined as one n-type buffer layer. In other words, the concentration profile of the n-type impurities in one n-type buffer layer may have two peaks in the depth direction, that is, in the direction from the second main surface toward the first main surface. The number of peaks is not limited to two, and may be three or more. The plurality of peaks are preferably heightened as nearing toward the second main surface.

In the first preferred embodiment, an example has been shown in which the semiconductor device 101 includes the p-type first collector layer 16A and the p-type second collector layer 16B. The p-type first collector layer 16A and the p-type second collector layer 16B may be defined as one p-type collector layer. In other words, the concentration profile of the p-type impurities in one p-type collector layer may have two peaks in the depth direction, that is, in the direction from the second main surface toward the first main surface.

Second Preferred Embodiment

In the second preferred embodiment, a method for manufacturing the semiconductor device 101 shown in the first preferred embodiment will be described.

FIG. 7 is a diagram showing a step of forming the n-type carrier accumulation layer 2 and the p-type base layer 15. A Si wafer on which the n⁻-type drift layer 1 is formed is prepared as a semiconductor substrate. The n-type impurities for forming the n-type carrier accumulation layer 2 are ion-implanted into the surface layer of the n⁻-type drift layer 1 from the first main surface side of the semiconductor substrate. Furthermore, p-type impurities for forming the p-type base layer 15 are ion-implanted into the first main surface of the semiconductor substrate. Annealing treatment is performed after ion implantation. The n-type impurities and the p-type impurities are diffused by the heat treatment, and the n-type carrier accumulation layer 2 and the p-type base layer 15 are formed.

FIG. 8 is a diagram showing a step of forming the n⁺-type emitter layer 13. The n-type impurities for forming the n+-type emitter layer 13 are ion-implanted into the surface layer of the p-type base layer 15 from the first main surface side of the semiconductor substrate. The n-type impurities are implanted into a predetermined region by a mask having an opening. After the ion implantation, an annealing treatment is performed, and the n⁺-type emitter layer 13 is selectively formed in the surface layer of the p-type base layer 15.

Figure 9:
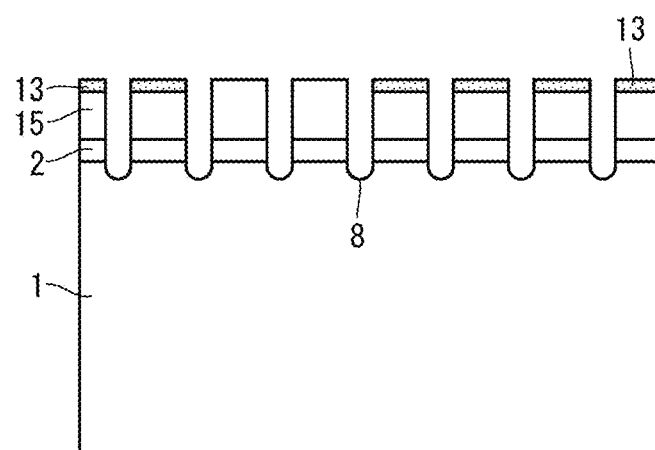
FIG. 9 is a diagram showing a method for manufacturing a semiconductor device.

FIG. 9 is a diagram showing a step of forming the trench 8. The trench 8 is formed by photolithography, etching, or the like. The trench 8 penetrates the p-type base layer 15 and the n-type carrier accumulation layer 2 from the first main surface of the semiconductor substrate and reaches the n⁻-type drift layer 1. Although not shown, in this step, cleaning, smoothing, rounding, and the like of the inner wall of the trench 8 may be performed using an etching technique and an oxidation technique in combination.

FIG. 10 is a diagram showing a step of forming the active trench gate 11 and the dummy trench gate 12. The semiconductor substrate is heated in an atmosphere containing oxygen. An oxide film is formed on the inner wall of the trench 8 and the first main surface of the semiconductor substrate. The oxide film formed on the inner wall of the trench 8 penetrating the n⁺-type emitter layer 13 corresponds to the gate trench insulating film 11b. The oxide film formed on the inner wall of the trench 8 provided in the region where the n⁺-type emitter layer 13 is not formed corresponds to the dummy trench insulating film 12b.

Next, polysilicon (d-poly Si) doped with n-type or p-type impurities is deposited inside the trench 8 by chemical vapor deposition (CVD) or the like. The impurity concentration of polysilicon is, for example, $1.0E+19$ atoms/cm³ or more. By this step, the gate trench electrode 11a is formed inside the trench 8 with the interposition of the gate trench insulating film 11b. The dummy trench electrode 12a is formed inside the trench 8 with the interposition of the dummy trench insulating film 12b.

FIG. 11 is a diagram showing a step of forming the interlayer insulating film 4 and the p⁺-type contact layer 14. After an insulating material film to be the interlayer insulating film 4 later is formed on the first main surface side of the semiconductor substrate, the insulating material film and the oxide film in a predetermined region are selectively etched. As a result, the n⁺-type emitter layer 13, the p⁺-type contact layer 14, and the dummy trench electrode 12a are exposed. The interlayer insulating film 4 is formed on the active trench gate 11 covered with the mask. In addition, the p⁺-type contact layer 14 is selectively formed in the surface layer of the p-type base layer 15.

FIG. 12 is a diagram showing a step of forming the silicide layer 9, the barrier metal 5, and the emitter electrode 6. The barrier metal 5 is formed on the first main surface and the interlayer insulating film 4 of the semiconductor substrate. The barrier metal 5 is formed by film-forming a metal film by physical vapor deposition (PVD) such as sputtering, or CVD, and the metal film being heat-treated. When the metal film is heat treated, the silicide layer 9 is formed by reaction between Si and metal. It should be noted that for convenience of description, the thickness of the silicide layer 9 in the drawing is enlarged. The actual silicide layer 9 is formed thin on the surface layer of the semiconductor substrate. Furthermore, the emitter electrode 6 is formed on the barrier metal 5. The emitter electrode 6 contains, for example, an aluminum silicon alloy (Al—Si-based alloy). The emitter electrode 6 is formed by PVD such as sputtering or vapor deposition. In addition, As the emitter electrode 6, a nickel alloy (Ni alloy) may be formed on an aluminum silicon alloy by electroless plating or electrolytic plating.

Figure 13:
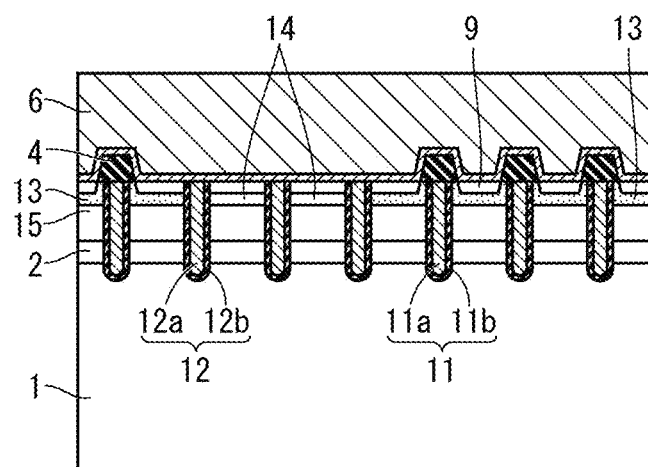
FIG. 13 is a diagram showing a method for manufacturing a semiconductor device.

FIG. 13 is a diagram showing a step of thinning the semiconductor substrate. The second main surface of the semiconductor substrate is ground and etched, and thinned to a predetermined thickness according to the design of the semiconductor device 101. The thickness of the semiconductor substrate after grinding is, for example, 40 μm or more and 700 μm or less. FIG. 14 is a diagram showing a list of steps of forming the structure on the second main surface side of the semiconductor device 101. Each step is executed in order from the top.

FIG. 15 is a diagram showing steps of forming the n-type first buffer layer 3A, the n-type second buffer layer 3B, the p-type first collector layer 16A, and the p-type second collector layer 16B.

First, the n-type first buffer layer 3A is formed. Specifically, n-type impurities for forming the n-type first buffer layer 3A are ion-implanted from the second main surface side of the semiconductor substrate. Examples of the n-type impurity include, for example, phosphorus and arsenic. After the ion implantation, the semiconductor substrate is annealed. This step is referred to as a first annealing step. To the first annealing step, for example, laser annealing is applied.

After the first annealing step, the n-type second buffer layer 3B is formed. Specifically, n-type impurities for forming the n-type second buffer layer 3B are ion-implanted from the second main surface side of the semiconductor substrate. Examples of the n-type impurity include, for example, selenium, sulfur, proton (H⁺), and helium. After the ion implantation, the semiconductor substrate is annealed. This step is referred to as a second annealing step. The annealing temperature in the second annealing step is lower than the annealing temperature in the first annealing step. In the second annealing step, the semiconductor substrate is heated, for example, at 375 to 425° C. for 90 minutes or more. Each of the n-type first buffer layer 3A and the n-type second buffer layer 3B may be activated by a different annealing method.

In the above steps, the n-type first buffer layer 3A and the n-type second buffer layer 3B shown in FIG. 2 are formed. Here, it is important that ion implantation for forming the n-type second buffer layer 3B is performed after the first annealing step for forming the n-type first buffer layer 3A. As described above, the annealing temperature in the first annealing step is higher than the annealing temperature in the second annealing step. Therefore, when the n-type impurities for forming the n-type second buffer layer 3B are implanted before the first annealing step, the impurity profile after activation of the n-type second buffer layer 3B is disturbed. In addition, this affects the type of lattice defects introduced for forming the n-type second buffer layer 3B, and adversely affects carriers (electrons or holes) in a device-ON state. Therefore, an ion implantation step for the n-type second buffer layer 3B is performed after the first annealing step for forming the n-type first buffer layer 3A.

In addition, in these steps, the n-type first buffer layer 3A and the n-type second buffer layer 3B are formed so as to satisfy the following relationship. As shown in FIG. 3, the peak position of the n-type impurities in the n-type second buffer layer 3B is closer to the junction ($X_{j,\ nb2}$) between the n-type second buffer layer 3B and the n⁻-type drift layer 1 than the junction ($X_{j,\ nb1}$) between the n-type first buffer layer 3A and the n-type second buffer layer 3B. This profile prevents the n-type first buffer layer 3A and the n-type second buffer layer 3B from interfering with each other. In other words, the n-type first buffer layer 3A and the n-type second buffer layer 3B are formed with high precision.

The n-type impurities for forming the n-type second buffer layer 3B are introduced into the semiconductor substrate from the second main surface with high acceleration energy. Proton (H⁺) and helium can be introduced not only by ion implantation but also by an irradiation technique using a cyclotron.

When protons (H⁺) are introduced into the Si wafer, complex defects in which vacancies (v) in the Si wafer and impurities in the Si crystal are bonded are generated. The complex defect contains hydrogen. Therefore, the complex defect functions as an electron supply source (donor). Since the annealing increases the density of complex defects, the donor concentration increases. The thermal donor phenomenon due to the ion implantation or irradiation process is promoted and the donor concentration is increased. As a result, the n-type semiconductor layer having a higher impurity concentration than the n⁻-type drift layer 1 contributes to the operation of the semiconductor device 101 as the n-type second buffer layer 3B. In other words, the performance of the device is improved by the complex defects formed in the n-type second buffer layer 3B.

On the other hand, the complex defects in the n-type second buffer layer 3B also include a defect serving as a lifetime killer that reduces the lifetime of the carrier. The order of forming the n-type second buffer layer 3B after forming the n-type first buffer layer 3A is important from the viewpoint of removal of defects functioning as lifetime killers and stability of the impurity concentration profile of the n-type second buffer layer 3B.

After the second annealing step, the p-type first collector layer 16A and the p-type second collector layer 16B are formed. First, p-type impurities for forming the p-type second collector layer 16B are ion-implanted into a deep position from the second main surface of the semiconductor substrate. Thereafter, p-type impurities for forming the p-type first collector layer 16A are ion-implanted into a shallow position from the second main surface of the semiconductor substrate.

At this time, the acceleration energy at the time of ion implantation is set so that a peak position ($R_{P1}$) of the p-type impurity concentration in the p-type first collector layer 16A and a peak position ($R_{P2}$) of the p-type impurity concentration in the p-type second collector layer 16B satisfy the formula (1). The peak position ($R_{P1}$) in the p-type first collector layer 16A and the peak position ($R_{P2}$) in the p-type second collector layer 16B correspond to the range during ion implantation. Furthermore, the dose amount at the time of ion implantation is set so that the number of atoms of the p-type impurities per unit area ($D_{P1}$) in the p-type first collector layer 16A and the number of atoms of the p-type impurities per unit area ($D_{P2}$) in the p-type second collector layer 16B satisfy the formula (2).

After the ion implantation, the semiconductor substrate is annealed. This step is a third annealing step. To the third annealing step, laser annealing or low-temperature annealing is applied. The low-temperature annealing is a technique of annealing at a temperature equal to or lower than the metal melting point. The third annealing step activates the p-type impurities, and forms the p-type first collector layer 16A and the p-type second collector layer 16B.

This third annealing step reproduces the profile of the p-type impurities at the time of ion implantation also after activation. As a result, a layer configuration in which the p-type first collector layer 16A and the p-type second collector layer 16B do not interfere with each other is formed. Here, even if the second annealing step is performed not immediately after the ion implantation step for the n-type second buffer layer but after the third annealing step, the effect of the n-type second buffer layer 3B can be obtained.

FIG. 16 is a diagram showing a step of forming the collector electrode 7. The collector electrode 7 is formed on the second main surface of the semiconductor substrate, that is, the front surface of the p-type first collector layer 16A. The collector electrode 7 has a configuration (not shown) in which a plurality of metal layers are stacked. Of the plurality of metal layers, the metal layer in contact with the p-type first collector layer 16A is preferably formed of AlSi or NiSi. The collector electrode 7 is formed by PVD such as sputtering or vapor deposition. In addition, an additional metal film may be formed as the collector electrode 7 by electroless plating or electrolytic plating on a metal film formed by PVD. Before the deposition of the metal layer, etching may be applied to the front surface of the p-type first collector layer 16A (light etching step).

The collector electrode 7 is annealed after a plurality of metal layers are formed. This is referred to as a fourth annealing step. The fourth annealing step forms an alloy layer or a silicide layer between the first metal layer and the p-type first collector layer 16A. With this, the collector electrode 7 is in ohmic contact with the p-type first collector layer 16A and is electrically connected thereto.

The semiconductor device 101 is manufactured by the above method. In the second preferred embodiment, the p+-type contact layer 14 sandwiched between the n⁺-type emitter layers 13 in the surface layer of the semiconductor substrate is omitted, but the p⁺-type contact layer 14 may be disposed so as to be sandwiched between the n+-type emitter layers 13 as in FIG. 2.

Modification of Second Preferred Embodiment

The method for manufacturing the semiconductor device 101 in the present modification includes a step of forming a getter site on the back side, that is, the second main surface side of the Si wafer so that the IGBT satisfies a value equal to or more than the carrier lifetime calculated by the following formula (3). In the formula (3), $t_{N-}$ is the thickness (unit: m) shown in FIG. 2. The $\tau_t$ is a carrier lifetime (unit: sec) of the n⁻-type drift layer 1.

$$\tau_t = 1.5 \times 10^{-5} \exp(5.4 \times 10^3 t_{N-}) \tag{3}$$

The ON voltages of the IGBT and the free wheeling diode (FWD) depend on the carrier lifetime of the n⁻-type drift layer 1. The formula (3) is a formula serving as an index for minimizing the dependency. When the carrier lifetime satisfies the formula (3), the influence of the carrier life on the switching loss can be controlled, and the turn-off loss is also affected by the carrier lifetime, which is effective for reducing the turn-off loss and suppressing the thermal runaway.

The getter site is formed on the back side of the Si wafer by the following process.

Figure 17:
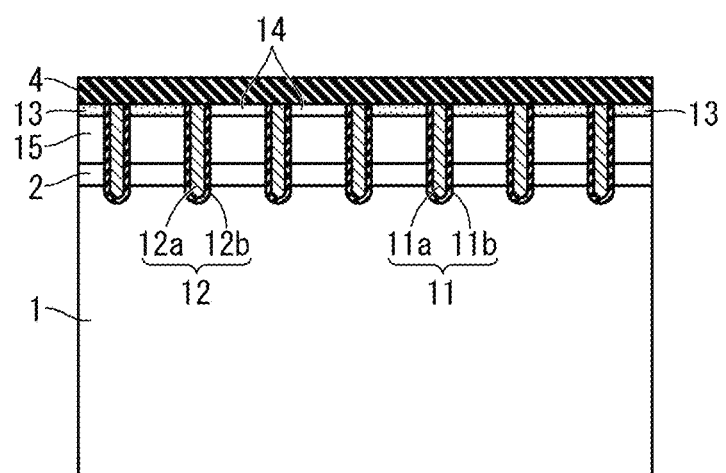
FIG. 17 is a diagram showing a method for manufacturing a semiconductor device.

FIG. 17 is a diagram showing a step of exposing the Si surface on the back surface of the Si wafer. In this step, only the back surface of the Si wafer is selectively etched. For example, the hack surface of the Si wafer is etched with hydrofluoric acid or mixed acid (for example, a liquid mixture of hydrofluoric acid, nitric acid, or acetic acid).

FIG. 18 is a diagram showing a step of forming the polysilicon layer 31. A polysilicon (d-poly Si) layer 31 containing n-type impurities for forming a high concentration if layer is formed on the back surface of the Si wafer by an LPCVD method. Examples of the n-type impurity for forming the high-concentration n$^+$ layer include, for example, phosphorus, arsenic, antimony, and the like. The n-type impurity concentration in the polysilicon layer 31 is 1.0E+19 atoms/cm$^3$ or more. In addition, the film thickness of the polysilicon layer 31 is 500 nm or more. The polysilicon layer 31 is in direct contact with the Si surface constituting the back surface of the wafer.

FIG. 19 is a diagram showing a step of forming a getter site. After the polysilicon layer 31 is formed, high-temperature annealing treatment is performed. The high-temperature annealing treatment is performed at a temperature of 900° C. or higher and 1000° C. or lower in a nitrogen atmosphere. By this high-temperature annealing treatment, the n-type impurities contained in the polysilicon layer 31 are diffused from the back surface of the Si wafer into the Si wafer, and the high-concentration n$^+$ layer 32 is formed. The front surface (lower surface) of the high-concentration n$^+$ layer 32 constitutes the back surface of the Si wafer, that is, the second main surface of the semiconductor substrate. The n-type impurity concentration on the lower surface of the high-concentration n$^+$ layer 32 is 1.0E+20 atoms/cm$^3$ or more and 1.0E+22 atoms/cm$^3$ or less. In addition, the width, that is, the depth of the high-concentration n$^+$ layer 32 is 1.0 μm or more and 10 μm or less from the back surface of the Si wafer.

When the high-concentration n$^+$ layer 32 is formed, crystal defects are secondarily generated. The layer in which the crystal defects are formed is referred to as a high crystal detect density layer 33.

The Si wafer, the polysilicon layer 31, the high concentration n$^+$ layer 32, and the high crystal defect density layer 33 have different thermal expansion coefficients from each other. Therefore, the above-described high-temperature annealing treatment causes strain at the interface between the Si wafer and the polysilicon layer 31, that is, the surface layer of the high-concentration n$^+$ layer 32. Defects are generated in the strained layer (not shown).

The strained layer in the surface layer of the high concentration n+ layer 32 and the high crystal defect density layer 33 function as getter sites.

After the high-temperature annealing treatment, the low-temperature annealing treatment is performed. The low-temperature annealing treatment is performed at a temperature of 500° C. or higher and 700° C. or lower in a nitrogen atmosphere. The temperature lowering speed from the high-temperature annealing treatment to the low-temperature annealing treatment is optional. At the time of temperature lowering, heavy metals or contaminated atoms present in the Si wafer are diffused at 600 to 700° C. and captured by getter sites.

This technique recovers the carrier lifetime in the if-drift layer reduced during the wafer process. An n$^-$-drift layer having a sufficiently long carrier lifetime that satisfies specifications of electrical characteristics of IGBTs and FWDs of various withstand voltage classes is achieved.

In the present modification, an example is shown in which the high crystal defect density layer 33 is formed by the polysilicon layer 31, but the high crystal defect density layer 33 can also be formed by laser annealing. For example, the high crystal defect density layer 33 is also formed by locally rapidly heating and then rapidly cooling the back surface of the Si wafer with a laser beam having a wavelength of 500 to 1000 nm. In that case, the power density of the laser beam is preferably 4 J/cm$^2$ or more.

The getter sites in which heavy metals or contaminated atoms are captured are removed before the n-type first buffer layer 3A, the n-type second buffer layer 3B, the p-type first collector layer 16A, and the p-type second collector layer 16B are formed, that is, in the step shown in FIG. 13.

Third Preferred Embodiment

A semiconductor device in a third preferred embodiment will be described. In the third preferred embodiment, the same components as those in the first or second preferred embodiment are denoted by the same reference numerals, and the detailed description thereof will be omitted.

FIG. 20 is a diagram showing a configuration of a semiconductor device 103 in the third preferred embodiment. A planar configuration of the semiconductor device 103 is similar to that of the semiconductor device 101 shown in FIG. 1. FIG. 20 shows a cross section taken along line A-A shown in FIG. 1. The semiconductor device 103 is a p-i-n diode.

The semiconductor device 103 includes a p-type anode layer 25, an n$^-$-type drift layer 1, an n-type first buffer layer 3A, an n-type second buffer layer 3B, an n$^+$-type first cathode layer 26A, an n$^+$-type second cathode layer 26B, an anode electrode 6A, and a cathode electrode 7A.

In the third preferred embodiment, the first main surface corresponds to the front surface (upper surface) of the p-type anode layer 25. The second main surface corresponds to the front surface (lower surface) of the n$^+$-type first cathode layer 26A. In other words, the semiconductor substrate corresponds to a range from the upper surface of the p-type anode layer 25 to the lower surface of the n$^+$-type first cathode layer 26A. The thickness of the semiconductor substrate is 40 μm or more and 700 μm or less. The profile of the impurity concentration along line C-C shown in FIG. 20 is similar to the profile shown in FIG. 3.

The n$^-$-type drift layer 1 has the same configuration as the n$^-$-type drift layer 1 in the first preferred embodiment. The n-type impurity concentration ($C_{n-}$) in the n$^-$-type drift layer 1 is preferably 1.0E+1.2 atoms/cm$^3$ or more and 1.0E+15 atoms/cm$^3$ or less.

The p-type anode layer 25 is provided on the first main surface side of the semiconductor substrate with respect to the n$^-$-type drift layer 1. The main joint surface between the p-type anode layer 25 and the n--type drift layer 1 is preferably positioned at a depth of 2.0 μm or more and 10 μm or less from the first main surface. The p-type anode layer 25 is a semiconductor layer containing, for example, boron, aluminum, or the like as p-type impurities. The p-type impurity concentration on the upper surface of the p-type anode layer 25 is preferably 1.0E+16 atoms/cm$^3$ or more. The peak concentration of the p-type impurities in the p-type anode layer 25 is preferably 2.0E+16 atoms/cm$^3$ or more and 1.0E+18 atoms/cm$^3$ or less.

The n-type first buffer layer 3A and the n-type second buffer layer 3B have configurations similar to those in the first preferred embodiment. That is, the n-type first buffer layer 3A and the n-type second buffer layer 3B are provided on the second main surface side of the semiconductor substrate with respect to the n⁻-type drift layer 1. The n-type first buffer layer 3A and the n-type second buffer layer 3B are arranged in this order in a direction from the second main surface toward the first main surface. The interface ($X_{j,\ nb1}$) between the n-type first buffer layer 3A and the n-type second buffer layer 3B is preferably positioned at a depth of 1.2 μm or lore and 5.0 μm or less from the second main surface. The interface ($X_{j,\ nb2}$) between the it-type second buffer layer 3B and the n⁻-type drift layer 1 is preferably positioned at a depth of 4.0 μm or more and 50 μm or less from the second main surface.

The peak concentration ($C_{nb1,\ p}$) of the n-type impurities in the n-type first buffer layer 3A is preferably 1.0E+16 atoms/cm³ or more and 5.0E+1.6 atoms/cm³ or less. The maximum peak concentration (($C_{nb2-n,\ p}$)$_{max}$) of the n-type impurities in the n-type second buffer layer 3B is higher than the concentration ($C_{n-}$) of the n-type impurities in the n⁻-type drift layer 1, and is 1.0E+15 atoms/cm³ or less.

The n⁺-type first cathode layer 26A and the n⁺-type second cathode layer 26B are provided on the second main surface side of the semiconductor substrate with respect to the n-type first buffer layer 3A. The n⁺-type first cathode layer 26A and the n⁺-type second cathode layer 26B are arranged in this order in a direction from the second main surface toward the first main surface. The interface between the n⁺-type first cathode layer 26A and the n⁺-type second cathode layer 26B is preferably positioned at a depth of 0.1 μm from the second main surface. The interface between the n⁺-type second cathode layer 26B and the n-type first buffer layer 3A is preferably positioned at a depth of 0.3 μm or more and 0.8 μm or less from the second main surface.

The n⁺-type first cathode layer 26A and the n⁺-type second cathode layer 26B are semiconductor layers containing, for example, arsenic, phosphorus, or the like as n-type impurities. The n-type impurity concentration on the front surface of the n+-type first cathode layer 26A, that is, the second main surface is preferably 1.0E+17 atoms/cm³ or more and 1.0E+18 atoms/cm³ or less. The peak concentration of the n-type impurities in the n⁺-type second cathode layer 26B is preferably 1.0E+16 atoms/cm³ or more and 1.0E+20 atoms/cm³ or less.

The depth ($R_{N1}$) from the second main surface where the peak of the n-type impurity concentration in the n⁺-type first cathode layer 26A is positioned and the depth ($R_{N2}$) from the second main surface where the peak of the n-type impurity concentration in the n⁺-type second cathode layer 26B is positioned preferably satisfy the following formula (4). The n⁺-type first cathode layer 26A has a function of improving the contact property with the cathode electrode 7A. The n⁺-type second cathode layer 26 has a function of controlling carrier injection efficiency ($\gamma_{n,\ active}$ in FIG. 20) from the second main surface side according to the number of atoms of n-type impurities per unit area.

$$R_{N2}/R_{N1} = 5.0 \quad (4)$$

The number of atoms of the n-type impurities per unit area ($D_{N1}$) in the n⁺-type first cathode layer 26A and the number of atoms of the n-type impurities per unit area ($D_{N2}$) in the n⁺-type second cathode layer 26B preferably satisfy the following formula (5).

$$D_{N2}/D_{N1} \geq 0.07 \quad (5)$$

The anode electrode 6A is provided on the p-type anode layer 25. The anode electrode 6A is preferably formed of, for example, an aluminum alloy (Al—Si-based alloy) containing aluminum and silicon. The anode electrode 6A is electrically connected to the p-type anode layer 25.

The cathode electrode 7A has the same configuration as the collector electrode 7 of the first preferred embodiment. That is, the cathode electrode 7A is provided on the n⁺-type first cathode layer 26A, and has a configuration in which a plurality of metal layers are stacked. Of the plurality of metal layers, the metal layer in contact with the n+-type first cathode layer 26A is formed of any one of metals, of Ti, AlSi, and NiSi. When the metal layer in contact with the n⁺-type first cathode layer 26A contains AlSi, the concentration of Si contained in the AlSi is preferably 1% or more and 3% or less. The cathode electrode 7A is in ohmic contact with and electrically connected to the n⁺-type first cathode layer 26A.

FIG. 21 is a diagram showing a list of steps of forming the structure on the second main surface side of semiconductor device 103 in the third preferred embodiment. The steps up to the second annealing step are similar to the method for manufacturing the semiconductor device 101 shown in the second preferred embodiment.

After the second annealing step, first, retype impurities for forming the n⁺-type second cathode layer 26B are ion-implanted into a deep position from the second main surface of the semiconductor substrate. Thereafter, n-type impurities for forming the n⁺-type first cathode layer 26A are ion-implanted into a shallow position from the second main surface of the semiconductor substrate. After the ion implantation, the semiconductor substrate is annealed in a third annealing step. With the above, the n⁺-type first cathode layer 26A and the n⁺-type second cathode layer 26B are formed. Subsequent steps are similar to those in the method for manufacturing the semiconductor device 101 shown in the second preferred embodiment. Here, even if the second annealing step is performed not immediately after the ion implantation step for the n-type second buffer layer but after the third annealing step, the effect of the n-type second buffer layer 3B can be obtained.

Figure 22:
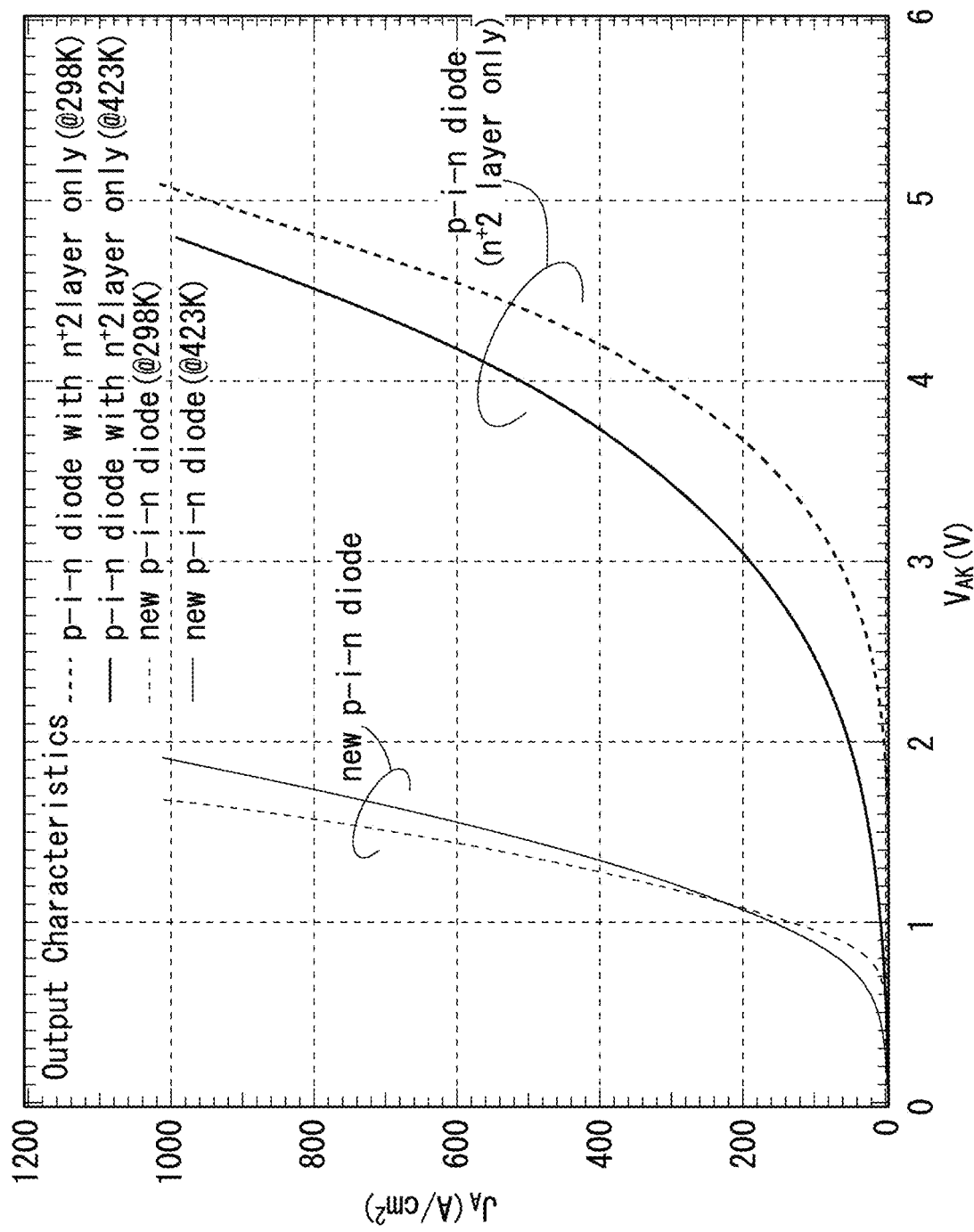
FIG. 22 is a diagram showing output characteristics of the semiconductor device.

FIG. 22 is a diagram showing output characteristics of the semiconductor device 103 in the third preferred embodiment. The "p-i-n diode (n⁺2 layer only)" indicates a p-i-n diode as a comparative example. Here, the n⁺-type cathode layer of the p-i-n diode of the "p-i-n diode (n⁺2 layer only)" is a single layer (that is, having one peak of the n-type impurity concentration). The p-i-n diode of the "p-i-n diode (n⁺2 layer only)" is provided with the n⁺-type second cathode layer 26B, but not provided with the n⁺-type first cathode layer 26A. The "new p-i-n diode" indicates the semiconductor device 103 in the third preferred embodiment. That is, the "new p-i-n diode" includes the n⁺-type first cathode layer 26A and the n⁺-type second cathode layer 26B described above. In addition, FIG. 22 shows each of the output characteristics under environments of 298K and 423K. The output characteristic of the "p-i-n diode" provided with the n⁺-type first cathode layer 26A rises at a low voltage, and a low ON voltage ($V_F$) is achieved. The ON voltage ($V_F$) is a $V_{AK}$ value at any current density ($J_A$) (here, defined as a rated current density.) on the vertical axis in FIG. 22. For example, when a $V_{AK}$ value with a rated current density of 337 A/cm² is set to the ON voltage ($V_F$), the ON voltage of the "new p-i-n diode" is smaller than the ON voltage of the "p-i-n diode (n⁺2 layer only)" by about ⅓.

Figure 23:
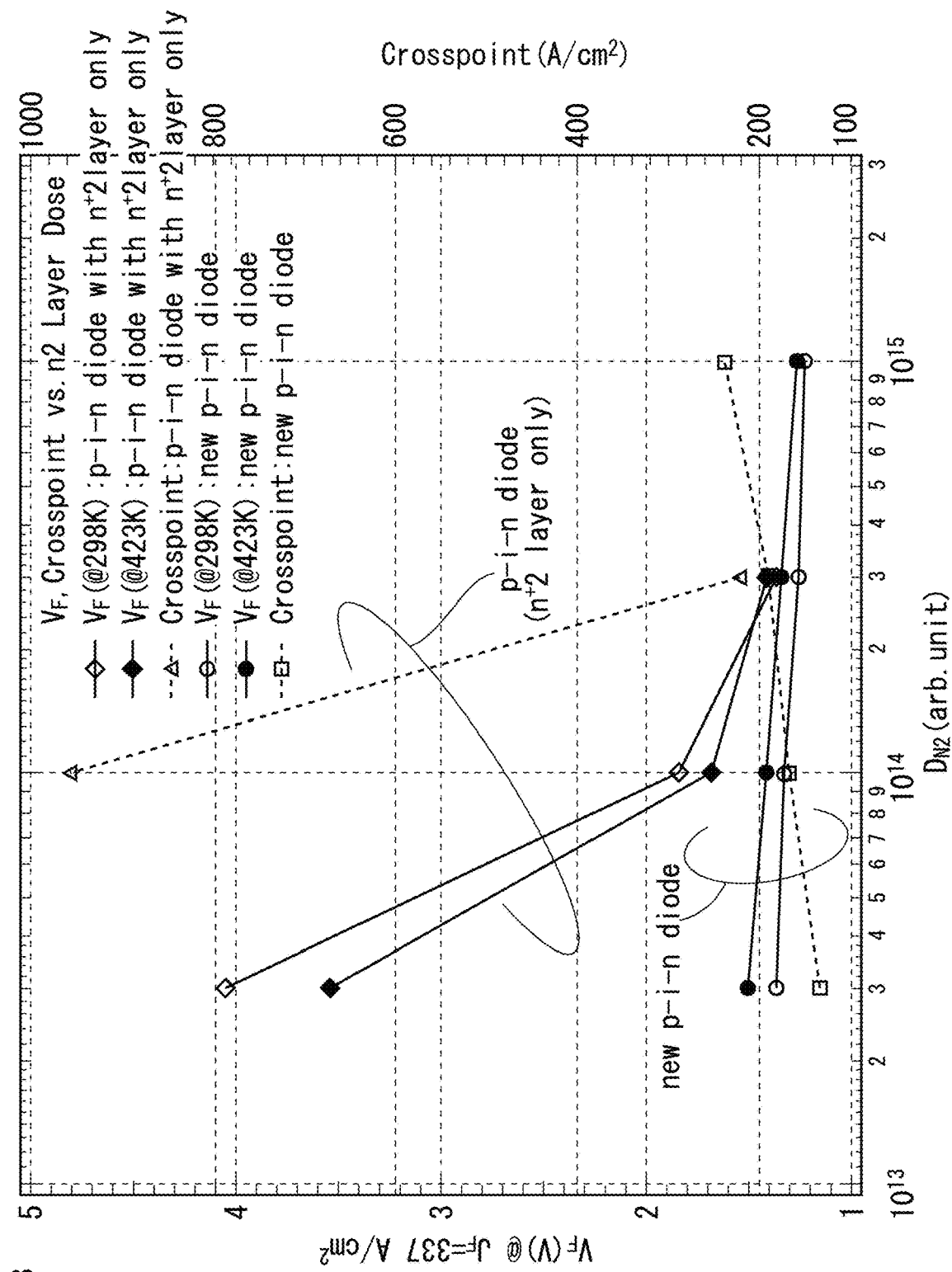
FIG. 23 is a diagram showing the relationship between an ON voltage and a cross point, and the number of atoms of impurities per unit area in the $n^+$-type second cathode layer.

FIG. 23 is a diagram showing a relationship between the ON voltage ($V_F$) and the number of atoms of the n-type impurities per unit area ($D_{N2}$) in the n⁺-type second cathode layer 26B under environments of 298K and 423K. In addition, FIG. 23 also shows a relationship between a current density (hereinafter, referred to as a cross point.) at which output characteristics under environments of 298K and 423K cross each other and the number of atoms of the n-type impurities per unit area ($D_{N2}$) in the n⁺-type second cathode layer 26B.

The semiconductor device 103 indicated by the "new p-i-n diode" in FIG. 23 suppresses a rapid increase in the ON voltage and decreases the current density at the cross point with respect to the decrease in the number of atoms of the n-type impurities per unit area ($D_{N2}$) in the n⁺-type second cathode layer 26B. These characteristics are effective from the viewpoint of avoiding current concentration on a specific semiconductor device when a module in which a plurality of semiconductor devices is mounted in parallel is in an ON state.

Figure 24:
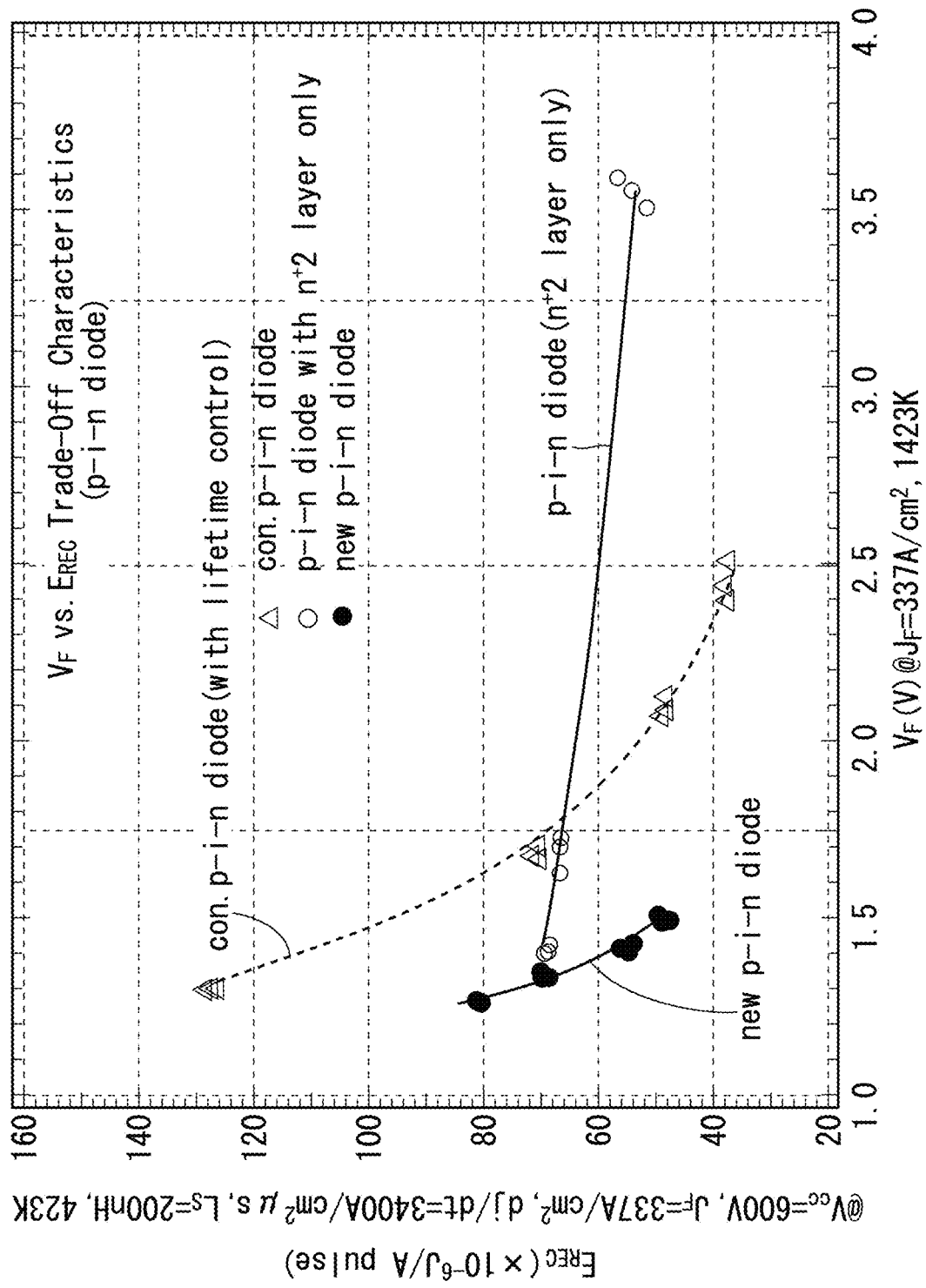
FIG. 24 is a diagram showing a relationship between an ON voltage and a turn-off switching loss.

FIG. 24 is a diagram showing a trade-off characteristic between the ON voltage ($V_F$) and the turn-off switching loss ($E_{REC}$). The turn-off switching loss corresponds to the recovery loss. The "con. p-i-n diode" indicates a p-i-n diode as a comparative example. The carrier lifetime control method is applied to a p-i-n diode of the "con. p-i-n diode". The "p-i-n diode (n⁺2 layer only)" and the "new p-i-n diode" are the same as those in FIG. 22. The trade-off characteristic of the "con, p-i-n diode" is controlled by the carrier lifetime control method. Each of the trade-off characteristics of the "new p-i-n diode" and the "p-i-n diode (n⁺2 layer only)" is controlled by the number of atoms of the n-type impurities per unit area ($D_{N2}$) in the n⁺-type second cathode layer 28B constituting the n⁺-type cathode layer.

In the semiconductor device 103 indicated by the "new p-i-n diode", the trade-off characteristic between the ON voltage and the turn-off switching loss is improved as compared with the trade-off characteristics of the two comparative examples indicated by the "con, p-i-n diode" and the "p-i-n diode (p⁺2 layer only)". This is because when the n⁺-type first cathode layer 26A and the n⁺-type second cathode layer 26B are formed, reducing the dose amount of ion implantation improves the carrier lifetime. In addition, in the "p-i-n diode (n⁺2 layer only)", the contact property between the cathode layer and the cathode electrode 7A decreases. Therefore, the trade-off characteristic of the "p-i-n diode (n⁺2 layer only)" is different from the nude-off characteristics of the "con. p-i-n diode" and the "new p-i-n diode".

Also in the semiconductor device 103 as described above, that is, also in the p-i-n diode, the trade-off characteristic between the ON voltage and the switching loss can be controlled. A trade-off characteristic between the ON voltage and the switching loss can be accurately controlled without the carrier lifetime control method being applied.

Fourth Preferred Embodiment

A semiconductor device in a fourth preferred embodiment will be described. In the fourth preferred embodiment, the same components as those in any one of the first to third preferred embodiments are denoted by the same reference numerals, and the detailed description thereof will be omitted.

FIG. 25 is a cross-sectional view showing the configuration of a semiconductor device 104 in the fourth preferred embodiment. A planar configuration of the semiconductor device 104 is similar to that of the semiconductor device 101 shown in FIG. 1. FIG. 25 shows a cross section taken along line A-A shown in FIG. 1. The semiconductor device 104 is a relaxed field of cathode (RFC) diode.

The semiconductor device 104 includes a p-type anode layer 25, an n⁻-type drift layer 1, an n-type first buffer layer 3A, an n-type second buffer layer 3B, an n⁺-type first cathode layer 26A, an n⁺-type second cathode layer 26B, a p-type first cathode layer 27A, a p-type second cathode layer 27B, an anode electrode 6A, and a cathode electrode 7A.

The n⁺-type cathode layer 26 including the n⁺-type first cathode layer 26A and the n⁺-type second cathode layer 26B and the p-type cathode layer 27 including the p-type first cathode layer 27A and the p-type second cathode layer 27B are alternately arranged in a direction in which the second main surface extends (left-right direction in FIG. 25). A diode in which the n⁺-type cathode layer 26 and the p-type cathode layer 27 are alternately arranged is referred to as an RFC diode. In the RFC diode, a region including the n⁺-type cathode layer 26 is also referred to as a p-i-n diode region, and a region including the p-type cathode layer 27 is also referred to as a transistor region.

In the fourth preferred embodiment, the first main surface corresponds to the front surface (upper surface) of the p-type anode layer 25. The second main surface corresponds to the front surface (lower surface) of the n⁺-type first cathode layer 26A and the front surface (lower surface) of the p-type first cathode layer 27A. In other words, the semiconductor substrate corresponds to a range from the upper surface of the p-type anode layer 25 to the lower surface of the rat-type first cathode layer 26A or the p-type first cathode layer 27A. The thickness of the semiconductor substrate is 40 µm or more and 700 µm or less. The profile of the impurity concentration along lines C-C and D-D shown in FIG. 25 is similar to the profile shown in FIG. 3.

The n-type impurity concentration ($C_{n-}$) in the n⁻-type drift layer 1 is preferably 1.0E+12 atoms/cm³ or more and 5.0E+14 atoms/cm³ or less.

The p-type anode layer 25 is provided on the first main surface side of the semiconductor substrate with respect to the n⁻-type drift layer 1. The main joint surface between the p-type anode layer 25 and the n⁻-type drift layer 1 is preferably positioned at a depth of 2.0 µm or more and 10 µm or less from the first main surface. The p-type impurity concentration on the upper surface of the p-type anode layer 25 is preferably 1.0E+16 atoms/cm³ or more. The peak concentration of the p-type impurities in the p-type anode layer 25 is preferably 2.0E+16 atoms/cm³ or more and 1.0E+18 atoms/cm³ or less.

The n-type first buffer layer 3A end the n-type second buffer layer 3B have configurations similar to those shown in the first and third preferred embodiments.

The n⁺-type first cathode layer 26A and the n⁺-type second cathode layer 26B have configurations similar to those shown in the third preferred embodiment. The interface between the n⁺-type first cathode layer 26A and the n⁺-type second cathode layer 26B is preferably positioned at a depth of 0.1 µm from the second main surface. The interface between the n⁺-type second cathode layer 26B and the n-type first buffer layer 3A is preferably positioned at a depth of 0.3 µm or more and 0.8 µm or less from the second main surface.

The n-type impurity concentration on the front surface of the n+-type first cathode layer 26A, that is, the second main surface is preferably 1.0E+17 atoms/cm³ or more and 1.0E+18 atoms/cm³ or less. The peak concentration of the n-type impurities in the n⁺-type second cathode layer 26B is preferably 1.0E+16 atoms/cm³ or more and 1.0E+20 atoms/cm³ or less.

The n⁺-type first cathode layer 26A and the n⁺-type second cathode layer 26B preferably satisfy the formula (4). Furthermore, the n⁺-type first cathode layer 26A and the n⁺-type second cathode layer 26B satisfy the formula (5).

The p-type first cathode layer 27A and the p-type second cathode layer 27B are provided on the second main surface side of the semiconductor substrate with respect to the n-type first buffer layer 3A. The p-type first cathode layer 27A and the p-type second cathode layer 27B are arranged in this order in a direction from the second main surface toward the first main surface. The interface between the p-type first cathode layer 27A and the p-type second cathode layer 27B is preferably positioned at a depth of 0.1 μm from the second main surface. The interface between the p-type second cathode layer 27B and the n-type first buffer layer 3A is preferably positioned at a depth of 0.3 μm or more and 0.8 μm or less from the second main surface.

The p-type first cathode layer 27A and the p-type second cathode layer 27B are semiconductor layers containing, for example, boron, aluminum, or the like as p-type impurities. The p-type impurity concentration on the front surface of the p-type first cathode layer 27A, that is, the second main surface is preferably 1.0E+17 atoms/cm³ or more and 1.0E+18 atoms/cm³ or less. The peak concentration of the p-type impurities in the p-type second cathode layer 27B is preferably 1.0E+16 atoms/cm³ or more and 1.0E+20 atoms/cm³ or less.

The depth ($R_{P1}$) from the second main surface where the peak of the p-type impurity concentration in the p-type first cathode layer 27A is positioned and the depth ($R_{P2}$) from the second main surface where the peak of the p-type impurity concentration in the p-type second cathode layer 27B is positioned preferably satisfy the formula (1). The number of atoms of the p-type impurities per unit area ($D_{P1}$) in the p-type first cathode layer 27A and the number of atoms of the p-type impurities per unit area ($D_{P2}$) in the p-type second cathode layer 27B satisfy the formula (2).

The anode electrode 6A and the cathode electrode 7A have configurations similar to those shown in the third preferred embodiment.

FIG. 26 is a diagram showing a list of steps of forming the structure on the second main surface side of semiconductor device 104 in the fourth preferred embodiment. The steps up to the second annealing step are similar to the method for manufacturing the semiconductor device 101 shown in the second preferred embodiment.

After the second annealing step, first, in a predetermined region of the semiconductor substrate, p-type impurities for forming the p-type second cathode layer 27B are ion-implanted into a deep position from the second main surface. Thereafter, in the same predetermined region, p-type impurities for forming the p-type first cathode layer 27A are ion-implanted into a shallow position from the second main surface. Next, in another predetermined region positioned adjacent to the predetermined region implanted with the p-type impurities, n-type impurities for forming the n⁺-type second cathode layer 26B are ion-implanted into a deep position from the second main surface. Thereafter, in the predetermined region, n-type impurities for forming the n⁺-type first cathode layer 26A are ion-implanted into a shallow position from the second main surface. After the ion implantation, the semiconductor substrate is annealed in a third annealing step. With the above, the n⁺-type first cathode layer 26A, the n⁺-type second cathode layer 26B, the p-type first cathode layer 27A, and the p-type second cathode layer 27B are formed. Subsequent steps are similar to those in the method for manufacturing the semiconductor device 101 shown in the second preferred embodiment. Here, even if the second annealing step is performed not immediately after the ion implantation step for the n-type second buffer layer but after the third annealing step, the effect of the n-type second buffer layer 3B can be obtained.

Also in this semiconductor device 104, effects similar to those shown in the first to third preferred embodiments are produced.

Fifth Preferred Embodiment

A semiconductor device in a fifth preferred embodiment will be described. In the fifth preferred embodiment, the same components as those in any one of the first to fourth preferred embodiments are denoted by the same reference numerals, and the detailed description thereof will be omitted.

Figure 27:
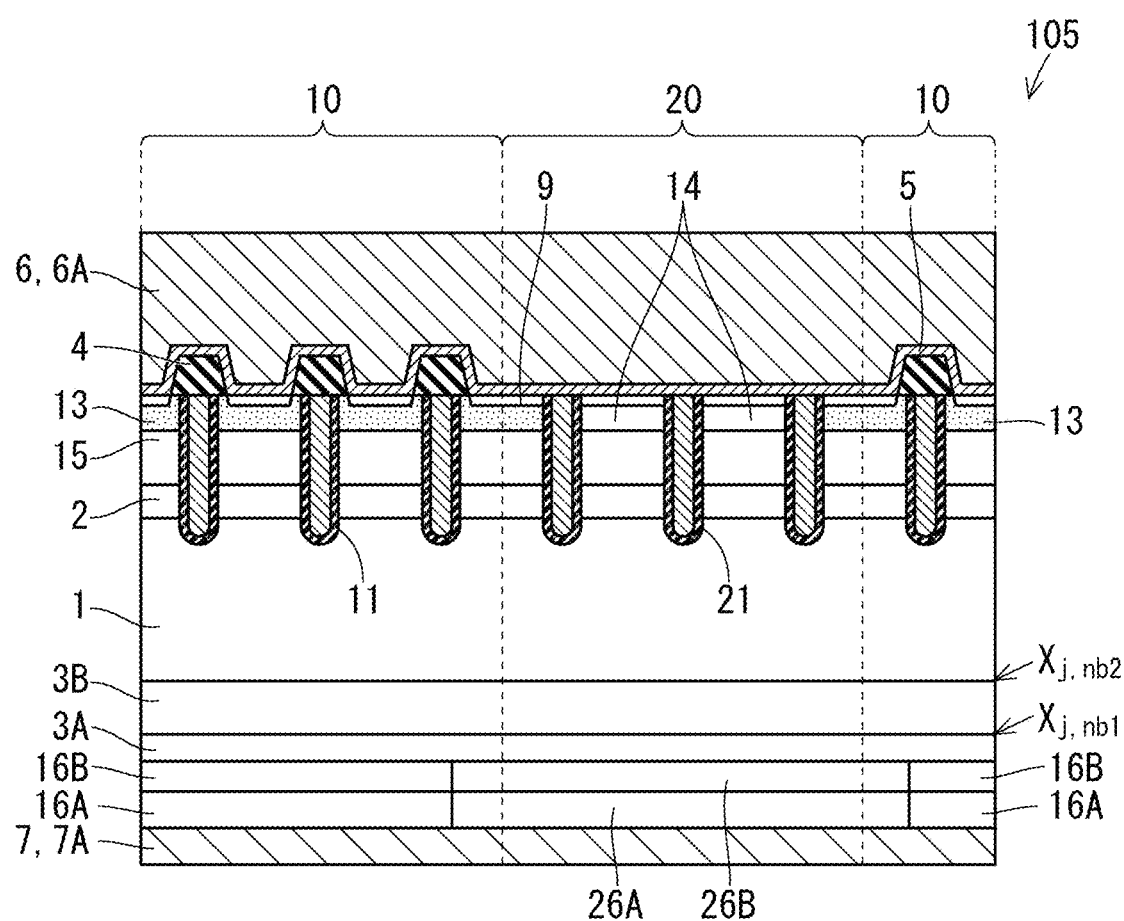
FIG. 27 is a cross-sectional view showing the configuration of the semiconductor device in a fifth preferred embodiment.

FIG. 27 is a cross-sectional view showing the configuration of a semiconductor device 105 in the fifth preferred embodiment. A planar configuration of the semiconductor device 105 is similar to that of the semiconductor device 101 shown in FIG. 1. FIG. 27 shows a cross section taken along line A-A shown in FIG. 1. The semiconductor device 105 is a reverse conducting IGBT (RC-IGBT). The semiconductor device 105 includes an IGBT region 10 and a diode region 20 adjacent to each other.

In the IGBT region 10, the semiconductor device 105 includes an n⁺-type emitter layer 13, a p-type base layer 15, an n-type carrier accumulation layer 2, an n⁻-type drift layer 1, an n-type first buffer layer 3A, an n-type second buffer layer 3B, a p-type first collector layer 16A, a p-type second collector layer 16B, an interlayer insulating film 4, a barrier metal 5, an emitter electrode 6, a collector electrode 7, and an active trench gate 11. The layer configuration in the IGBT region 10 may be the same as the layer configuration of the IGBT shown in FIG. 2.

In the diode region 20, the semiconductor device 105 includes a p⁺-type contact layer 14, a p-type base layer 15, an n-type carrier accumulation layer 2, an n⁻-type drift layer 1, an n-type first buffer layer 3A, an n-type second buffer layer 3B, an n⁺-type first cathode layer 26A, an n⁺-type second cathode layer 26B, a bather metal 5, an anode electrode 6A, a cathode electrode 7A, and a diode trench gate 21. The configurations of the anode electrode 6A and the cathode electrode 7A are similar to the configurations of the emitter electrode 6 and the collector electrode 7, respectively. The configuration of the diode trench gate 21 is similar to the configuration of the dummy trench gate 12. In the diode region 20, the layer configurations on the first main surface side and the second main surface side are different from those of the IGBT region 10.

In the fifth preferred embodiment, the first main surface corresponds to the front surfaces (upper surfaces) of the n⁺-type emitter layer 13 and the p⁺-type contact layer 14. The second main surface corresponds to the front surface (lower surface) of the n⁺-type first cathode layer 26A and the front surface (lower surface) of the p-type first cathode layer 27A. In other words, the semiconductor substrate corresponds to a range from the upper surfaces of the n⁺-type emitter layer 13 and the p⁺-type contact layer 14 to the lower surfaces of the p-type first collector layer 16A and the n⁺-type first cathode layer 26A. The thickness of the semiconductor substrate is 40 μm or more and 700 μm or less.

The n-type impurity concentration ($C_{n^-}$) in the n⁻-type drift layer 1 is preferably 1.0E+12 atoms/cm³ or more and 5.0E+14 atoms/cm³ or less.

The peak concentration of the n-type impurities in the n-type carrier accumulation layer 2 is preferably 1.0E+15 atoms/cm$^3$ or more and 1.0E+17 atoms/cm$^3$ or less.

The joint surface between the p-type base layer 15 and the n-type earner accumulation layer 2 is preferably positioned at a depth larger than the n$^+$-type emitter layer 13 and smaller than the n-type carrier accumulation layer 2 from the first main surface. The peak concentration of the p-type impurities in the p-type base layer 15 is preferably 1.0E+16 atoms/cm$^3$ or more and 1.0E+1.8 atoms/cm$^3$ or less. In the fifth preferred embodiment, the p-type base layer 15 in the diode region 20 corresponds to what is called the p-type anode layer.

The n$^+$-type emitter layer 13 is provided on the first main surface side of the semiconductor substrate with respect to the p-type base layer 15 in the IGBT region 10. The joint surface between the n$^+$-type emitter layer 13 and the p-type base layer 15 is preferably positioned at a depth of 0.2 μm or more and 1.0 μm or less from the first main surface. The peak concentration of the n-type impurities in the n$^+$-type emitter layer 13 is preferably 1.0E+18 atoms/cm$^3$ or more and 1.0E+21 atoms/cm$^3$ or less.

The p$^+$-type contact layer 14 is provided on the first main surface side of the semiconductor substrate with respect to the p-type base layer 15 in the diode region 20. The p$^+$-type contact layer 14 is provided up to the same depth as the n$^+$-type emitter layer 13 or up to a position deeper than the n$^+$-type emitter layer 13. The peak concentration of the p-type impurities in the p$^+$-type contact layer 14 is preferably 1.0E+18 atoms/cm$^3$ or more and 1.0E+21 atoms/cm$^3$ or less.

The interface $X_{j,\,nb1}$ between the n-type first buffer layer 3A and the n-type second buffer layer 3B is preferably positioned at a depth of 1.2 μm or more and 5.0 μm or less from the second main surface. The interface $(X_{j,\,nb2})$ between the n-type second buffer layer 3B and the n$^-$-type drift layer 1 is preferably positioned at a depth of 4.0 μm or more and 50 μm or less from the second main surface.

The peak concentration $(C_{nb1,\,p})$ of the n-type impurities in the n-type first buffer layer 3A is preferably 1.0E+16 atoms/cm$^3$ or more and 5.0E+16 atoms/cm$^3$ or less. The maximum peak concentration $((C_{nb2-n,\,p})_{max})$ of the n-type impurities in the n-type second buffer layer 3B is higher than the concentration $(C_{n-})$ of the n-type impurities in the n$^-$-type drift layer 1, and is 1.0E+15 atoms/cm$^3$ or less.

The interface between the p-type first collector layer 16A and the p-type second collector layer 16B is preferably positioned at a depth of 0.1 μm from the second main surface. The interface between the p-type second collector layer 16B and the n-type first buffer layer 3A is preferably positioned at a depth of 0.3 μm or more and 0.8 μm or less from the second main surface.

The concentration of the p-type impurities on the front surface of the p-type first collector layer 16A, that is, the second main surface is preferably 1.0E+17 atoms/cm$^3$ or more and 1.0E+18 atoms/cm$^3$ or less. The peak concentration of the p-type impurities in the p-type second collector layer 16B is preferably 1.0E+16 atoms/cm$^3$ or more and 1.0E+20 atoms/cm$^3$ or less.

The depth $(R_{P1})$ from the second main surface where the peak of the concentration of the p-type impurities in the p-type first collector layer 16A is positioned and the depth $(R_{P2})$ from the second main surface where the peak of the concentration of the p-type impurities in the p-type second collector layer 16B is positioned preferably satisfy the formula (1). The number of atoms of the p-type impurities per unit area $(D_{P1})$ in the p-type first collector layer 16A and the number of atoms of the p-type impurities per unit area $(D_{P2})$ in the p-type second collector layer 16B preferably satisfy the formula (2).

The interface between the n$^+$-type first cathode layer 26A and the n$^+$-type second cathode layer 26B is preferably positioned at a depth of 0.1 μm from the second main surface. The interface between the n$^+$-type second cathode layer 26B and the n-type first buffer layer 3A is preferably positioned at a depth of 0.3 μm or more and 0.8 μm or less from the second main surface. The n-type impurity concentration on the front surface of the n+-type first cathode layer 26A, that is, the second main surface is preferably 1.0E+17 atoms/cm$^3$ or more and 1.0E+18 atoms/cm$^3$ or less. The peak concentration of the n-type impurities in the n$^+$-type second cathode layer 26B is preferably 1.0E+16 atoms/cm$^3$ or more and 1.0E+20 atoms/cm$^3$ or less.

The depth $(R_{N1})$ from the second main surface where the peak of the n-type impurity concentration in the n$^+$-type first cathode layer 26A is positioned and the depth $(R_{N2})$ from the second main surface where the peak of the n-type impurity concentration in the n$^+$-type second cathode layer 26B is positioned preferably satisfy the formula (4). The number of atoms of the n-type impurities per unit area $(D_{N1})$ in the n$^+$-type first cathode layer 26A and the number of atoms of the n-type impurities per unit area $(D_{N2})$ in the n$^+$-type second cathode layer 26B preferably satisfy the formula (5).

The emitter electrode 6, the collector electrode 7, the anode electrode 6A, and the cathode electrode 7A have configurations similar to those shown in the first or third preferred embodiment.

FIG. 28 is a diagram showing a list of steps of forming the structure on the second main surface side of the semiconductor device 105 in the fifth preferred embodiment. The steps up to the second annealing step are similar to the method for manufacturing the semiconductor device 101 shown in the second preferred embodiment.

After the second annealing step, first, p-type impurities for forming the p-type second collector layer 16B are ion-implanted into a deep position from the second main surface of the IGBT region 10. Thereafter, p-type impurities for forming the p-type first collector layer 16A are ion-implanted into a shallow position from the second main surface of the IGBT region 10. Next, n-type impurities for forming the n$^+$-type second cathode layer 26B are ion-implanted into a deep position from the second main surface of the diode region 20. Thereafter, n-type impurities for forming the n$^+$-type first cathode layer 26A are ion-implanted into a shallow position from the second main surface of the diode region 20. After the ion implantation, the semiconductor substrate is annealed in a third annealing step. With the above, the p-type first collector layer 16A, the p-type second collector layer 16B, the n$^+$-type first cathode layer 26A, and the n$^+$-type second cathode layer 26B are formed. Subsequent steps are similar to those in the method for manufacturing the semiconductor device 101 shown in the second preferred embodiment. Here, even if the second annealing step is performed not immediately after the ion implantation step for the n-type second buffer layer but after the third annealing step, the effect of the n-type second buffer layer 3B can be obtained.

Also in this semiconductor device 105, effects similar to those shown in the first to fifth preferred embodiments are produced.

Sixth Preferred Embodiment

A semiconductor device in a sixth preferred embodiment will be described. In the sixth preferred embodiment, the same components as those in any one of the first to fifth preferred embodiments are denoted by the same reference numerals, and the detailed description thereof will be omitted.

Figure 29:
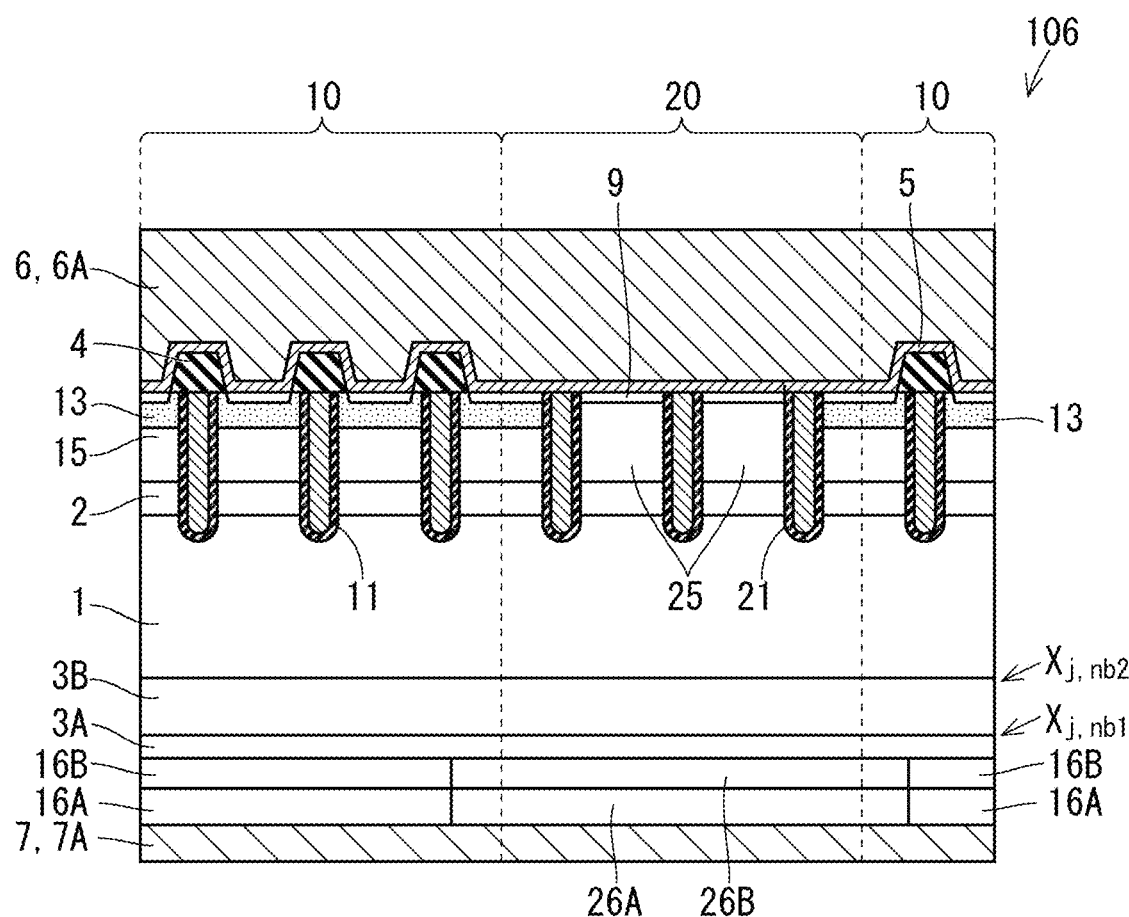
FIG. 29 is a cross-sectional view showing the configuration of the semiconductor device in a sixth preferred embodiment.

FIG. 29 is a cross-sectional view showing the configuration of a semiconductor device 106 in the sixth preferred embodiment. A planar configuration of the semiconductor device 106 is similar to that of the semiconductor device 101 shown in FIG. 1. FIG. 29 shows a cross section taken along line A-A shown in FIG. 1. The semiconductor device 106 is an RC-IGBT.

The configuration in the IGBT region 10 of the semiconductor device 106 is the same as the configuration in the IGBT region 10 of the semiconductor device 105 of the fifth preferred embodiment. The configuration in the diode region 20 of the semiconductor device 106 is different from the configuration in the diode region 20 of the semiconductor device 105. The semiconductor device 106 includes a p-type anode layer 25 instead of the p$^+$-type contact layer 14 and the p-type base layer 15.

The p-type anode layer 25 is provided on the first main surface side of the semiconductor substrate with respect to the n$^-$-type drift layer 1. The p-type anode layer 25 is formed deeper than the n$^+$-type emitter layer 13 in the IGBT region 10. The joint surface between the p-type anode layer 25 and the n-type carrier accumulation layer 2 is preferably positioned at a depth of 0.5 µm or more and 1.0 µm or less from the first main surface. The p-type impurity concentration on the upper surface of the p-type anode layer 25 is preferably 1.0E+16 atoms/cm$^3$ or more. The peak concentration of the p-type impurities in the p-type anode layer 25 is preferably 2.0E+16 atoms/cm$^3$ or more and 1.0E+18 atoms/cm$^3$ or less.

Other configurations of the semiconductor device 106 are similar to those of the semiconductor device 105. Also in this semiconductor device 106, effects similar to those shown in the first to fifth preferred embodiments are produced.

Seventh Preferred Embodiment

A semiconductor device in a seventh preferred embodiment will be described. In the seventh preferred embodiment, the same components as those in any one of the first to sixth preferred embodiments are denoted by the same reference numerals, and the detailed description thereof will be omitted.

Figure 30:
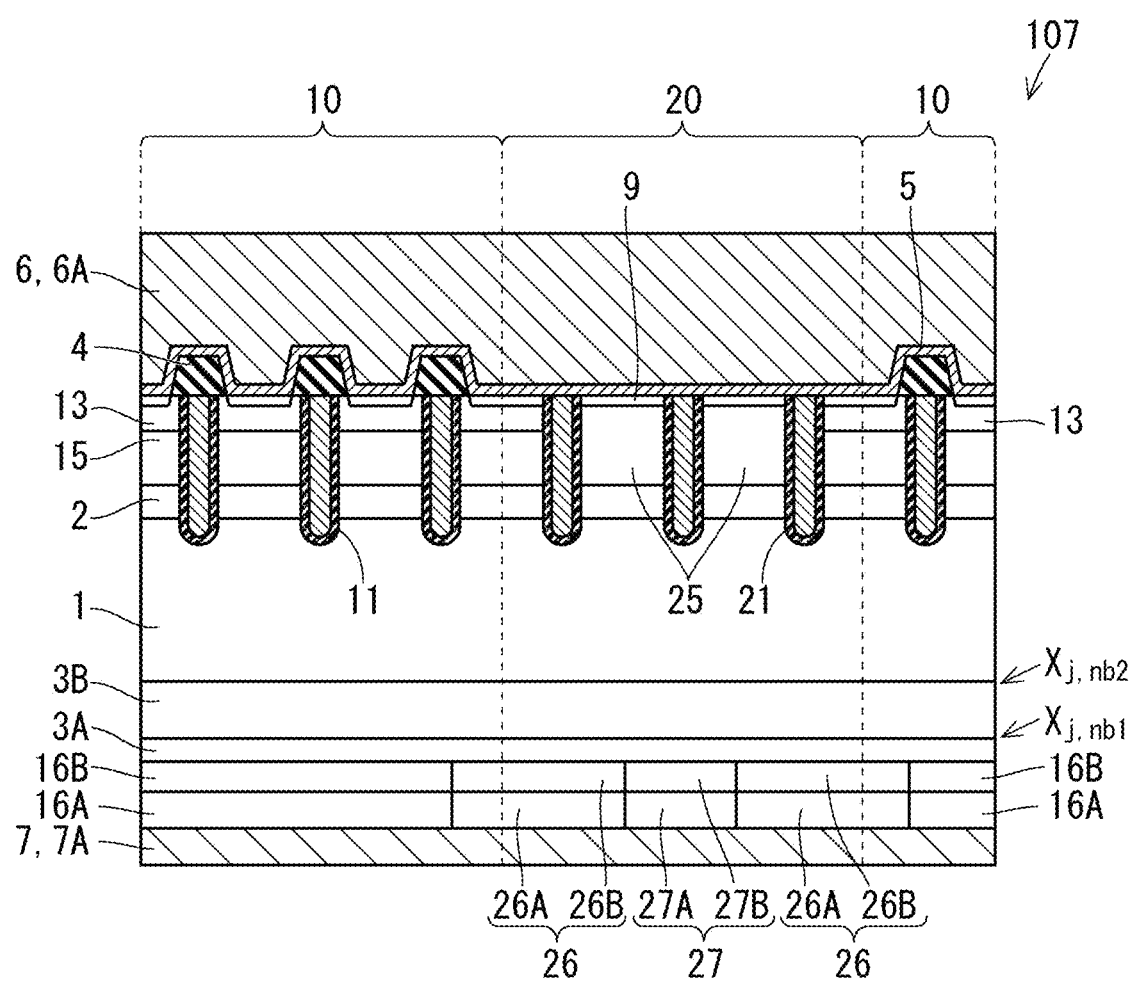
FIG. 30 is a cross-sectional view showing the configuration of the semiconductor device in a seventh preferred embodiment.

FIG. 30 is a cross-sectional view showing the configuration of a semiconductor device 107 in the seventh preferred embodiment. A planar configuration of the semiconductor device 107 is similar to that of the semiconductor device 101 shown in FIG. 1. FIG. 30 shows a cross section taken along line A-A shown in FIG. 1.

The semiconductor device 107 is obtained by modifying the structure on the second main surface side (back side) in the diode region 20 of the semiconductor device 106 into the relaxed field of cathode (RFC) structure shown in the fourth preferred embodiment. That is, the semiconductor device 107 has a configuration in which RFC is applied to the RC-IGBT. The configuration in the IGBT region 10 of the semiconductor device 107 is the same as those of the semiconductor device 105 and the semiconductor device 106.

In the diode region 20, the n$^+$-type cathode layer 26 including the n$^+$-type first cathode layer 26A and the n$^+$-type second cathode layer 26B and the p-type cathode layer 27 including the p-type first cathode layer 27A and the p-type second cathode layer 27B are alternately arranged in a direction in which the second main surface extends. The configurations of the n$^+$-type first cathode layer 26A, the n$^+$-type second cathode layer 26B, the p-type first cathode layer 27A, and the p-type second cathode layer 27B are the same as the configurations shown in the fourth preferred embodiment. In addition, the method for manufacturing those is also the same as the method shown in the fourth preferred embodiment.

Also in this semiconductor device 107, effects shown in the first to sixth preferred embodiments are produced.

Eighth Preferred Embodiment

A semiconductor device in an eighth preferred embodiment will be described. In the eighth preferred embodiment, the same components as those in any one of the first to seventh preferred embodiments are denoted by the same reference numerals, and the detailed description thereof will be omitted. Hereinafter, the semiconductor substrate is referred to as a Si wafer, and a semiconductor layer constituting the second main surface of the Si wafer is referred to as a diffusion layer. That is, the diffusion layer is a semiconductor layer of any one of the p-type first collector layer 16A, the n$^+$-type first cathode layer 26A, and the p-type first cathode layer 27A.

As described above, the collector electrode 7 has a configuration in which a plurality of metal layers are stacked. Of the plurality of metal layers, the metal layer in contact with the diffusion layer is formed of any one of metals, of Ti, AlSi, and NiSi. For example, the metal layer in contact with the p-type first collector layer 16A is formed of AlSi or NiSi.

FIG. 31 is a diagram showing the type of metal constituting the first metal layer, the conductivity type of the diffusion layer in contact with the first metal layer, and the contact resistivity thereof. Materials that exhibit good contact characteristics for any of n-type and p-type diffusion layers are NiSi and AlSi.

NiSi is formed by film-forming Ni by a sputtering method and then causing the Ni to react with Si in a fourth annealing step. In particular, NiSi is more excellent in contact property than AlSi. It should be noted that each of the n-type diffusion layer and the p-type diffusion layer is a layer formed at a dose amount of 1.0E+15 atoms/cm$^2$ during ion implantation.

Figure 32:
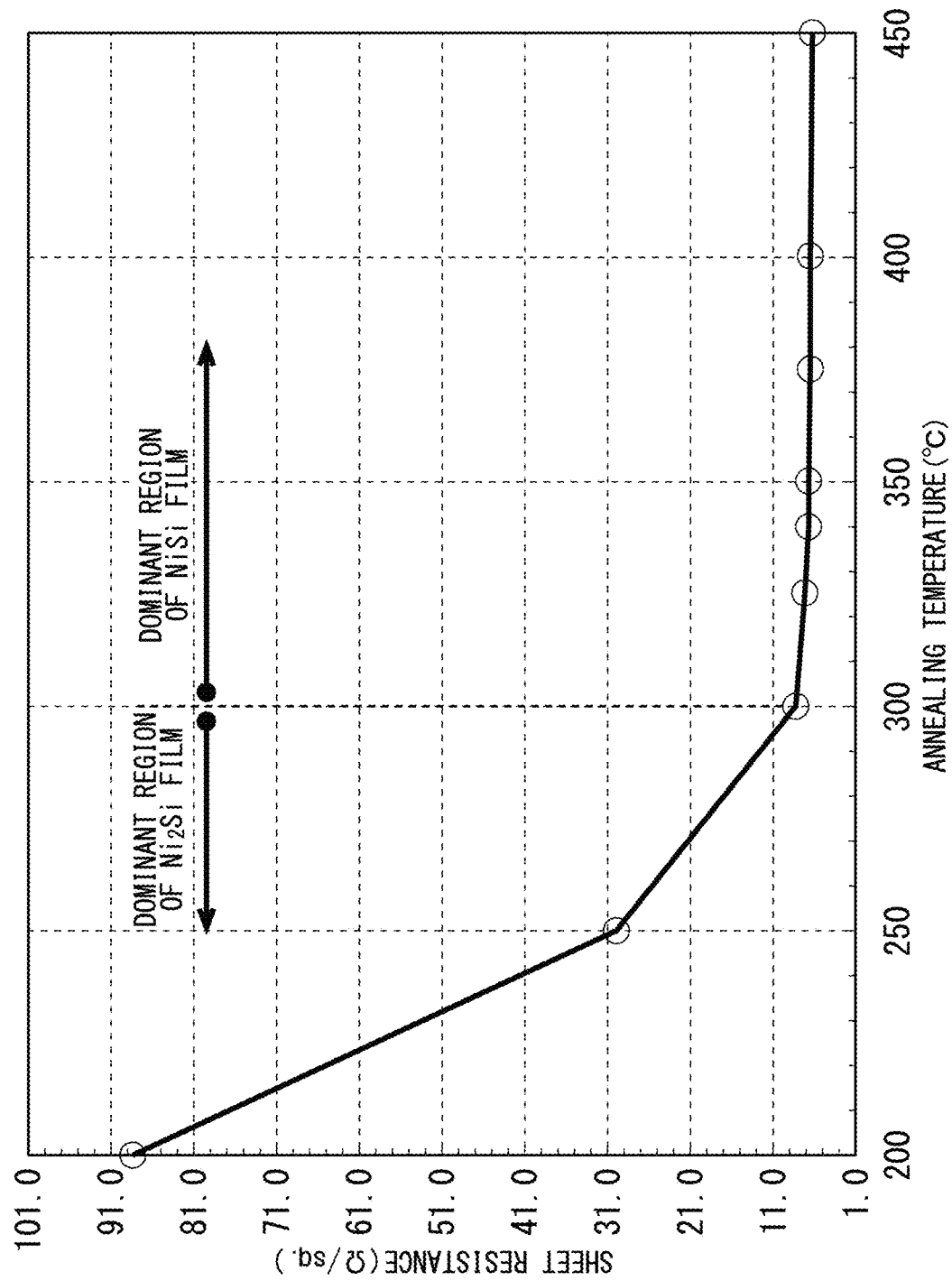
FIG. 32 is a diagram showing the relationship between the annealing temperature and the sheet resistance of the first metal layer containing Ni.

FIG. 32 is a diagram showing the relationship between the annealing temperature and the sheet resistance of the first metal layer containing Ni in the fourth annealing step. The Ni forms various silicide layers depending on the annealing temperature. When the annealing temperature is 300° C. or higher, a monosilicide (NiSi) layer having low sheet resistance is formed. For example, in the semiconductor device 101 shown in the first preferred embodiment, since an aluminum wiring line exists in the region where the first metal layer is not formed, the annealing temperature in the fourth annealing step needs to be set to 300° C. or higher and a temperature lower than the temperature in the second annealing step.

Figure 33:
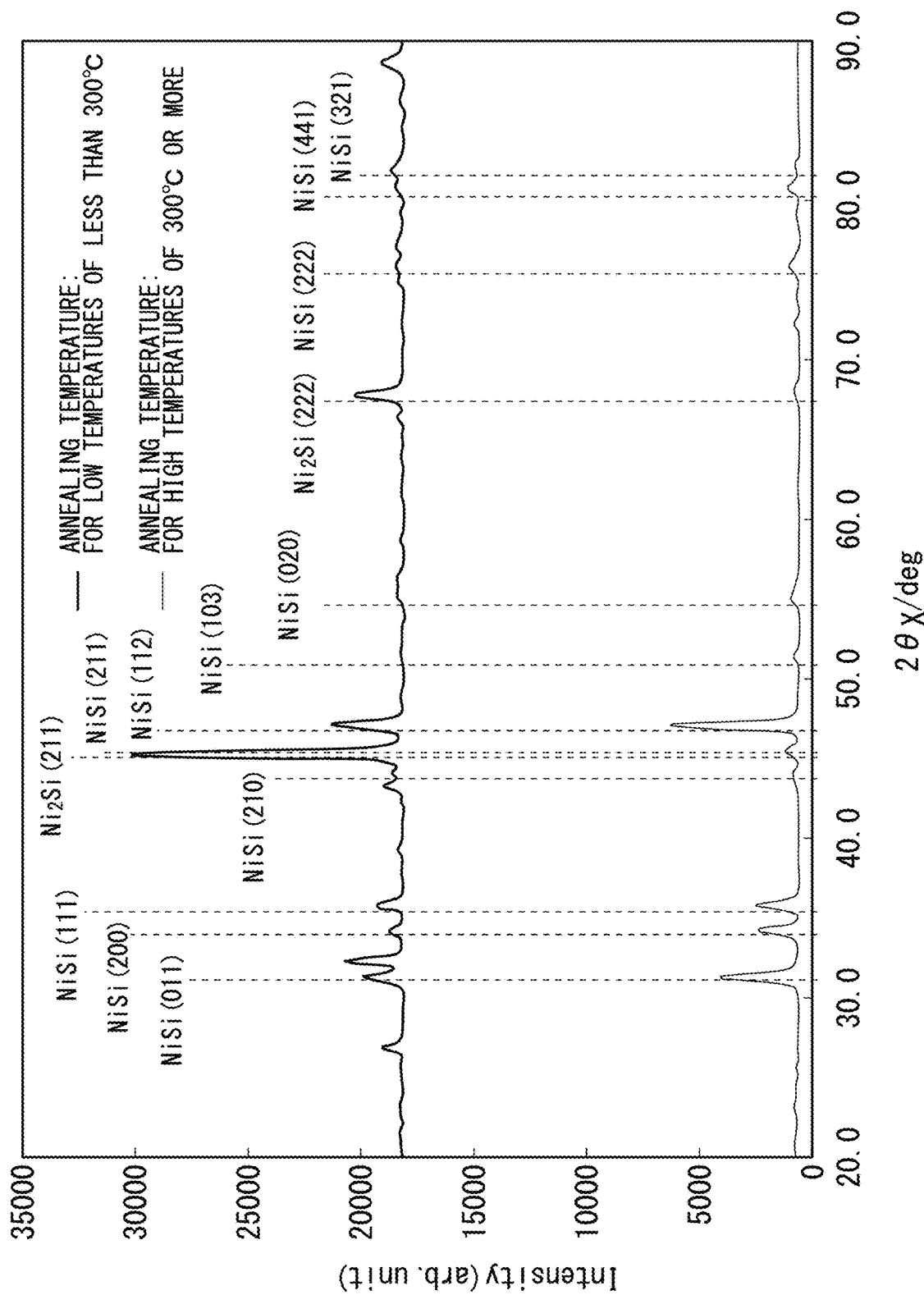
FIG. 33 is a diagram shoving a spectrum of the first metal layer analyzed by the X-ray diffraction method.

FIG. 33 shows a spectrum of the first metal layer analyzed by the X-rays diffraction method. Monosilicide (NiSi) is detected in the first metal layer annealed at 300° C. or higher.

As shown in FIG. 31, NiSi exhibits a good contact property to any of the n-type diffusion layer and the p-type diffusion layer. That is, NiSi exhibits a good contact property also to the p-type first collector layer 16A shown in the first preferred embodiment, and exhibits a good contact property also to the n$^+$-type first cathode layer 26A shown in the second preferred embodiment. As a result, by controlling the number of atoms of impurities per unit area ($D_{P2}$ or $D_{N2}$, respectively) in the p-type second collector layer 16B or the n$^+$-type second cathode layer 26B, the carrier injection efficiency ($\gamma_{p,\ active}$ in FIG. 2 or $\gamma_{n,\ active}$, in FIG. 20) from the second main surface side can be controlled. This semiconductor device can accurately control a trade-off characteristic between an ON voltage and a switching loss without the carrier lifetime control method being applied.

FIG. 34 is a diagram showing a relationship between an ON voltage ($V_{CE\ (sat)}$) and a measurement temperature in an IGBT including a first metal layer containing Al. FIG. 34 shows each of the ON voltage when the first metal layer is Al and the ON voltage when the first metal layer is AlSi (Si addition amount: 1 to 3%). In addition, FIG. 34 shows photographs of the front surface of Si at the interface between Si and the first metal layer.

The fourth annealing step reacts Al with Si to cause a spike on the Si front surface. The spike refers to a state in which Si diffuses into Al and Al protrudes into Si in a wedge shape. Such a spike decreases the carrier injection efficiency from the second main surface, that is, the back side. In particular, the efficiency is reduced at a low temperature. As shown in FIG. 34, at a low temperature of 300K or less, the ON voltage characteristic when the first metal layer is an Al film is different from the ON voltage characteristic when the first metal layer is an AlSi film. The ON voltage characteristic in the AlSi film in which no spike is generated on the Si front surface exhibits a "positive" behavior with respect to the measurement temperature (behavior in which the ON voltage also rises with temperature rise). In the semiconductor device such as the IGBT or the FWD, the ON voltage characteristic with respect to the measurement temperature preferably exhibits a "positive" behavior. Since a plurality of semiconductor devices are mounted in a multi-parallel state in the power semiconductor module, such a "positive" behavior prevents a current from concentrating on a specific chip when the device is in an ON state. Therefore, the IGBT having the AlSi film has performance required as a power semiconductor.

In addition, the AlSi film exhibits a good contact property with the p-type first collector layer 16A or the n$^+$-type first cathode layer 26A. As a result, by controlling the number of atoms of impurities per unit area ($D_{P2}$ or $D_{N2}$, respectively) in the p-type second collector layer 16B or the n$^+$-type second cathode layer 26B, the carrier injection efficiency ($\gamma_{p,\ active}$ in FIG. 2 or $\gamma_{n,\ active}$ in FIG. 20) from the second main surface side can be controlled. This semiconductor device can accurately control a trade-off characteristic between an ON voltage and a switching loss without the carrier lifetime control method being applied.

In the present disclosure, each preferred embodiment can be freely combined, and each preferred embodiment can be appropriately modified or omitted.

While the disclosure has been shown and described in detail, the foregoing description is in all aspects illustrative and not restrictive. It is therefore understood that numerous modifications and variations can be devised.

What is claimed is:

1. A semiconductor device comprising:
    a semiconductor substrate including a first main surface and a second main surface opposite to the first main surface;
    a drift layer of a first conductivity type provided between the first main surface and the second main surface of the semiconductor substrate;
    a buffer layer of the first conductivity type provided on a second main surface side with respect to the drift layer and having a larger number of atoms of impurities per unit volume than the drift layer; and
    a dual-layer semiconductor layer comprising a first semiconductor layer and a second semiconductor layer, provided on the second main surface side with respect to the buffer layer, the first semiconductor layer and the second semiconductor layer being arranged in this order in a direction from the second main surface toward the first main surface,
    wherein the first semiconductor layer and the second semiconductor layer have conductivity types identical to each other,
    the second semiconductor layer has a larger number of atoms of impurities per unit volume than the first semiconductor layer,
    the first semiconductor layer directly contacts the second semiconductor layer, and
    the dual-layer semiconductor layer has two consecutive peaks for the number of atoms of impurities per unit volume from the second main surface side of the dual-layer semiconductor layer toward the first main surface side of the dual-layer semiconductor layer, each of the first semiconductor layer and the second semiconductor layer having one of the two peaks.

2. The semiconductor device according to claim 1, further comprising an electrode in which a plurality of metal layers are stacked on the second main surface of the semiconductor substrate.

3. The semiconductor device according to claim 2, wherein, of the plurality of metal layers, a metal layer in contact with the second main surface of the semiconductor substrate contains NiSi.

4. The semiconductor device according to claim 2, wherein
    of the plurality of metal layers, a metal layer in contact with the second main surface of the semiconductor substrate contains AlSi, and
    a concentration of Si contained in the AlSi is 1% or more and 3% or less.

5. The semiconductor device according to claim 1, wherein the number of atoms of impurities per unit area in the first semiconductor layer and the number of atoms of impurities per unit area in the second semiconductor layer satisfy a relation of:

$$D_2/D_1 \geq 0.07.$$

6. The semiconductor device according to claim 1, further comprising:
    a base layer of a second conductivity type provided on a first main surface side with respect to the drift layer;
    an emitter layer of the first conductivity type provided as a surface layer of the semiconductor substrate on the first main surface side with respect to the base layer and forming the first main surface; and
    a gate electrode provided inside a trench penetrating the emitter layer and the base layer from the first main surface with an interposition of an insulating film,
    wherein the first semiconductor layer and the second semiconductor layer have the second conductivity type, and
    the emitter layer, the base layer, the drift layer, the buffer layer, the first semiconductor layer, the second semiconductor layer, and the gate electrode form an insulated gate bipolar transistor.

7. The semiconductor device according to claim 1, further comprising an anode layer of a second conductivity type provided on a first main surface side with respect to the drift layer,
  wherein the first semiconductor layer and the second semiconductor layer have the first conductivity type.

8. The semiconductor device according to claim 1, further comprising an anode layer of a second conductivity type provided on a first main surface side with respect to the drift layer,
  wherein the first semiconductor layer and the second semiconductor layer include a region having the first conductivity type and a region having the second conductivity type which are alternately arranged in a direction in which the second main surface extends.

9. The semiconductor device according to claim 1, wherein
  the semiconductor substrate includes an IGBT region in which an IGBT is formed and a diode region in which a diode is formed,
  the IGBT region includes:
  the first semiconductor layer;
  the second semiconductor layer;
  the drift layer;
  a base layer of a second conductivity type provided on a first main surface side with respect to the drift layer;
  an emitter layer of the first conductivity type provided as a surface layer of the semiconductor substrate on the first main surface side with respect to the base layer and forming the first main surface; and
  a gate electrode provided inside a trench penetrating the emitter layer and the base layer from the first main surface with an interposition of an insulating film,
  the first semiconductor layer and the second semiconductor layer in the IGBT region have the second conductivity type,
  the diode region includes:
  the first semiconductor layer;
  the second semiconductor layer;
  the drift layer; and
  an anode layer of the second conductivity type provided on the first main surface side with respect to the drift layer, and
  the first semiconductor layer and the second semiconductor layer in the diode region have the first conductivity type.

10. The semiconductor device according to claim 1, wherein
  the semiconductor substrate includes an IGBT region in which an IGBT is formed and a diode region in which a diode is formed,
  the IGBT region includes:
  the first semiconductor layer;
  the second semiconductor layer;
  the drift layer;
  a base layer of a second conductivity type provided on a first main surface side with respect to the drift layer;
  an emitter layer of the first conductivity type provided as a surface layer of the semiconductor substrate on the first main surface side with respect to the base layer and forming the first main surface; and
  a gate electrode provided inside a trench penetrating the emitter layer and the base layer from the first main surface with an interposition of an insulating film,
  the first semiconductor layer and the second semiconductor layer in the IGBT region have the second conductivity type,
  the diode region includes:
  the first semiconductor layer;
  the second semiconductor layer;
  the drift layer; and
  an anode layer of the second conductivity type provided on the first main surface side with respect to the drift layer, and
  the first semiconductor layer and the second semiconductor layer in the diode region include a region having the first conductivity type and a region having the second conductivity type which are alternately arranged in a direction in which the second main surface extends.

11. The semiconductor device according to claim 7, further comprising a contact layer of the second conductivity type provided as a surface layer of the semiconductor substrate on the first main surface side with respect to the anode layer and forming the first main surface.

12. The semiconductor device according to claim 7, wherein the anode layer is a surface layer of the semiconductor substrate, and forms the first main surface.

13. A semiconductor device comprising:
  a semiconductor substrate including a first main surface and a second main surface opposite to the first main surface;
  a drift layer of a first conductivity type provided between the first main surface and the second main surface of the semiconductor substrate;
  a buffer layer of the first conductivity type provided on a second main surface side with respect to the drift layer and having a larger number of atoms of impurities per unit volume than the drift layer; and
  a first semiconductor layer and a second semiconductor layer, provided on the second main surface side with respect to the buffer layer and arranged in this order in a direction from the second main surface toward the first main surface,
  wherein the first semiconductor layer and the second semiconductor layer have conductivity types identical to each other,
  the second semiconductor layer has a larger number of atoms of impurities per unit volume than the first semiconductor layer,
  the first semiconductor layer has a peak for the number of atoms of impurities per unit volume in the direction from the second main surface toward the first main surface,
  the second semiconductor layer has a peak for the number of atoms of impurities per unit volume in the direction from the second main surface toward the first main surface, and
  a depth from the second main surface at which the peak of the number of atoms per unit volume in the first semiconductor layer is positioned and a depth from the second main surface at which the peak of the number of atoms per unit volume in the second semiconductor layer is positioned satisfy a relation of:

$R_2/R_1 = 5.0.$

14. A semiconductor device comprising:
  a semiconductor substrate including a first main surface and a second main surface opposite to the first main surface;
  a drift layer of a first conductivity type provided between the first main surface and the second main surface of the semiconductor substrate;
  a buffer layer of the first conductivity type provided on a second main surface side with respect to the drift layer and having a larger number of atoms of impurities per unit volume than the drift layer; and a first semiconductor layer and a second semiconductor layer, provided on the second main surface side with respect to the buffer layer and arranged in this order in a direction from the second main surface toward the first main surface, wherein the first semiconductor layer and the second semiconductor layer have conductivity types identical to each other, the second semiconductor layer has a larger number of atoms of impurities per unit volume than the first semiconductor layer, the buffer layer has a plurality of peaks for the number of atoms of impurities per unit volume in the direction from the second main surface toward the first main surface, and the plurality of peaks are heightened as nearing toward the second main surface.

15. The semiconductor device according to claim 14, wherein of the plurality of peaks in the buffer layer, the impurity corresponding to a peak close to the second main surface is phosphorus or arsenic, and of the plurality of peaks in the buffer layer, the impurity corresponding to a peak closer to the first main surface than the peak close to the second main surface is an element other than phosphorus and arsenic.

16. The semiconductor device according to claim 14, wherein, of the plurality of peaks in the buffer layer, a maximum peak is lower than a peak for the number of atoms of impurities per unit volume in the direction from the second main surface toward the first main surface of the second semiconductor layer.

17. The semiconductor device according to claim 14, wherein, of the plurality of peaks in the buffer layer, a maximum peak is lower than a peak for the number of atoms of impurities per unit volume in the direction from the second main surface toward the first main surface of the first semiconductor layer.

* * * * *